US011825702B2

(12) United States Patent
Song et al.

(10) Patent No.: US 11,825,702 B2
(45) Date of Patent: Nov. 21, 2023

(54) DISPLAY DEVICE INCLUDING A DISPLAY PANEL INCLUDING CORNER PORTIONS HAVING CUT PATTERNS DEFINED BY CUT PORTIONS AND METHOD OF FABRICATING THE SAME

(71) Applicant: Samsung Display Co., LTD., Yongin-si (KR)

(72) Inventors: Chang Yeong Song, Suwon-si (KR); Jong Woo Kim, Hwaseong-si (KR); Yong Chan Ju, Yongin-si (KR); Jae Heung Ha, Suwon-si (KR); Won Jong Kim, Suwon-si (KR); Hee Yeon Park, Seoul (KR); Hye In Yang, Siheung-si (KR); Woo Suk Jung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 69 days.

(21) Appl. No.: 17/231,142

(22) Filed: Apr. 15, 2021

(65) Prior Publication Data
US 2022/0052137 A1 Feb. 17, 2022

(30) Foreign Application Priority Data

Aug. 13, 2020 (KR) .................... 10-2020-0101676

(51) Int. Cl.
*H10K 59/124* (2023.01)
*H10K 50/844* (2023.01)
(Continued)

(52) U.S. Cl.
CPC ......... *H10K 59/124* (2023.02); *H10K 50/844* (2023.02); *H10K 59/122* (2023.02);
(Continued)

(58) Field of Classification Search
CPC ............ H01L 51/5256; H01L 27/3258; H01L 27/3246; H01L 51/5253; H01L 51/56;
(Continued)

(56) References Cited

U.S. PATENT DOCUMENTS

| 10,205,123 B2 * | 2/2019 | Jin | ...................... H01L 51/5253 |
| 2015/0034935 A1 * | 2/2015 | Choi | ................... H01L 51/0097 |
|  |  |  | 257/40 |

(Continued)

FOREIGN PATENT DOCUMENTS

| CN | 111243442 B | 12/2021 |
| EP | 3651201 A1 | 5/2020 |

(Continued)

OTHER PUBLICATIONS

Extended European Search Report for Application No. 21191113.6 dated Jan. 27, 2022.

*Primary Examiner* — Caleb E Henry
(74) *Attorney, Agent, or Firm* — CANTOR COLBURN LLP

(57) ABSTRACT

An embodiment of the invention provides a display device including a display panel including corner portions having cut patterns defined by cut portions. The display panel includes a substrate, a light-emitting element including a pixel electrode, an emissive layer and a common electrode and disposed on the substrate in the cut pattern, a first inorganic encapsulation layer disposed on the common electrode in the cut pattern; an organic encapsulation layer disposed on the first inorganic encapsulation layer in the cut pattern; and an organic pattern disposed on the substrate in the cut portions.

20 Claims, 31 Drawing Sheets

(51) Int. Cl.
*H10K 59/122* (2023.01)
*H10K 71/00* (2023.01)
*H10K 59/40* (2023.01)
*H10K 59/12* (2023.01)
*H10K 77/10* (2023.01)
*H10K 102/00* (2023.01)

(52) U.S. Cl.
CPC ......... *H10K 71/00* (2023.02); *H10K 59/1201* (2023.02); *H10K 59/40* (2023.02); *H10K 77/111* (2023.02); *H10K 2102/311* (2023.02)

(58) Field of Classification Search
CPC ............... H01L 27/323; H01L 51/0097; H01L 2227/323; H01L 2251/5338; H01L 27/3244; H01L 51/5262; H10K 59/124; H10K 50/844; H10K 59/122; H10K 71/00; H10K 59/1201; H10K 59/40; H10K 77/111; H10K 2102/311; H10K 59/12; H10K 50/85; H10K 50/8445; Y02E 10/549; G06F 3/0412
See application file for complete search history.

(56) References Cited

U.S. PATENT DOCUMENTS

| | | | |
|---|---|---|---|
| 2016/0268352 A1* | 9/2016 | Hong | H01L 27/3276 |
| 2017/0288168 A1 | 10/2017 | Kim et al. | |
| 2017/0338294 A1* | 11/2017 | Choi | H01L 27/3276 |
| 2019/0157607 A1* | 5/2019 | Kim | H01L 51/5256 |
| 2019/0207131 A1 | 7/2019 | Lu | |
| 2020/0144522 A1 | 5/2020 | Jung et al. | |
| 2020/0170126 A1 | 5/2020 | Ahn et al. | |
| 2020/0395420 A1* | 12/2020 | Bok | G01L 1/205 |
| 2021/0083212 A1 | 3/2021 | Jung et al. | |
| 2021/0149524 A1* | 5/2021 | Bang | G06F 3/0445 |
| 2021/0280822 A1 | 9/2021 | Wang | |

FOREIGN PATENT DOCUMENTS

| | | |
|---|---|---|
| EP | 3660818 A1 | 6/2020 |
| KR | 101461037 B1 | 11/2014 |
| KR | 1020160013489 A | 2/2016 |
| KR | 1020180062155 A | 6/2018 |
| KR | 1020190027986 A | 3/2019 |
| KR | 1020200042029 A | 4/2020 |
| WO | 2019183935 A1 | 10/2019 |

\* cited by examiner

DISPLAY DEVICE INCLUDING A DISPLAY PANEL INCLUDING CORNER PORTIONS HAVING CUT PATTERNS DEFINED BY CUT PORTIONS AND METHOD OF FABRICATING THE SAME

This application claims priority to Korean Patent Application No. 10-2020-0101676 filed on Aug. 13, 2020, and all the benefits accruing therefrom under 35 U.S.C. § 119, the content of which in its entirety is herein incorporated by reference.

BACKGROUND

1. Field

The present disclosure relates to a display device and a method for fabricating the same.

2. Description of the Related Art

As the information-oriented society evolves, various demands for a display device are ever increasing. For example, the display device is employed by a variety of electronic devices such as smart phones, digital cameras, laptop computers, navigation devices, and smart televisions.

The display device may be a flat panel display device such as a liquid-crystal display device, a field emission display device, and a light-emitting display device. The light-emitting display device includes an organic light-emitting display device including an organic light-emitting element, an inorganic light-emitting display device including an inorganic light-emitting element such as an inorganic semiconductor, and a micro-light-emitting display device including an ultra-small light-emitting element.

As the display device is employed by various electronic devices, the display device is required to have various designs. For example, when the display device is a light-emitting display device, images may be displayed not only on the front surface portion but also on the side surface portions bent at the four edges of the front surface portion, respectively. For example, such a display device may include a corner portion disposed between the first side surface portion bent at a first side edge of the front surface portion and the second side surface portion bent at a second side edge of the front surface portion. A high strain may be applied to the corner portion due to the double curvature, i.e., the curvature of the first side surface portion and the curvature of the second side surface portion.

SUMMARY

Embodiments of the invention provide a display device in which an organic encapsulation layer for covering particles can be formed reliably in cut patterns at corner portions of the display device where the cut patterns and cut grooves for reducing strain at the corner portions are formed.

Embodiments of the invention provide a display device a method of fabricating a display device in which an organic encapsulation layer for covering particles can be formed reliably in cut patterns at corner portions of the display device where the cut patterns and cut grooves for reducing strain at the corner portions are formed.

An embodiment of the invention provides a display device including a display panel including corner portions having cut patterns defined by cut portions. The display panel includes a substrate, a light-emitting element including a pixel electrode, an emissive layer and a common electrode and disposed on the substrate in the cut pattern, a first inorganic encapsulation layer disposed on the common electrode in the cut pattern; an organic encapsulation layer disposed on the first inorganic encapsulation layer in the cut pattern; and an organic pattern disposed on the substrate in the cut portions.

The organic encapsulation layer and the organic pattern may include a same material.

The first inorganic encapsulation layer may be disposed between the substrate and the organic pattern at the cut portions.

The first inorganic encapsulation layer may be in contact with the substrate at the cut portions.

The display panel may further include a second inorganic encapsulation layer disposed on the organic encapsulation layer and the organic pattern.

The display panel further may include a buffer layer disposed on the substrate in the cut pattern, an active layer of a thin-film transistor disposed on the buffer layer in the cut pattern, a gate insulator disposed on the active layer in the cut pattern, a gate electrode of the thin-film transistor disposed on the gate insulator in the cut pattern, and a first interlayer-dielectric layer disposed on the gate electrode in the cut pattern. The light-emitting element may be disposed on the first interlayer-dielectric layer.

The organic pattern may be disposed on the buffer layer at the cut portions.

The first inorganic encapsulation layer may be disposed between the buffer layer and the organic pattern at the cut portions.

The first inorganic encapsulation layer may be in contact with the buffer layer at the cut portions.

The organic pattern may be disposed on the gate insulator at the cut portions.

The first inorganic encapsulation layer may be disposed between the gate insulator and the organic pattern at the cut portions.

The first inorganic encapsulation layer may be in contact with the gate insulator at the cut portions.

The organic pattern may be disposed on the first interlayer-dielectric layer at the cut portions.

The first inorganic encapsulation layer may be disposed between the first interlayer-dielectric layer and the organic pattern at the cut portions.

The first inorganic encapsulation layer may be in contact with the first interlayer-dielectric layer.

The display panel further may include a capacitor electrode disposed on the first interlayer-dielectric layer in the cut pattern, a second interlayer-dielectric layer disposed on the capacitor electrode in the cut pattern; a source electrode and a drain electrode of the thin-film transistor disposed on the second interlayer-dielectric layer in the cut pattern and connected to the active layer through contact holes penetrating the gate insulator, the first interlayer-dielectric layer and the second interlayer-dielectric layer; a first planarization layer disposed on the first connection electrode in the cut pattern; a connection electrode disposed on the first planarization layer in the cut pattern and connected to the source electrode or the drain electrode through a contact hole penetrating the first planarization layer; and a second planarization layer disposed on the connection electrode in the cut pattern. The light-emitting element may be disposed on the second planarization layer, and the pixel electrode may be connected to the connection electrode through a contact hole penetrating the second planarization layer.

The organic pattern may be disposed on the second interlayer-dielectric layer at the cut portions.

The first inorganic encapsulation layer may be disposed between the second interlayer-dielectric layer and the organic pattern at the cut portions.

The first inorganic encapsulation layer may be in contact with the second interlayer-dielectric layer.

The first planarization layer and the second planarization layer may not be disposed in the cut portions.

An embodiment of the invention provides a method of fabricating a display device including: forming a buffer layer on a substrate, forming an active layer of a thin-film transistor on the buffer layer, forming a gate insulator on the active layer, forming a gate electrode of the thin-film transistor on the gate insulator, forming an interlayer-dielectric layer on the gate electrode, and forming a source electrode and a drain electrode of the thin-film transistor on the interlayer-dielectric layer, forming a first planarization layer on the source electrode and the drain electrode, forming a connection electrode on the first planarization layer, and forming a second planarization layer on the connection electrode, forming cut patterns and cut portions by removing from a position of the cut portions at least one of the buffer layer, the gate insulator, the interlayer-dielectric layer, and the first planarization layer with a laser, forming a light-emitting element including a pixel electrode, an emissive layer, and a common electrode on the second planarization layer in the cut patterns, and simultaneously forming a first inorganic encapsulation layer on the common electrode in the cut patterns and the first inorganic encapsulation layer on the substrate at the cut portions.

BRIEF DESCRIPTION OF THE DRAWINGS

These and/or other features of the invention will become apparent and more readily appreciated from the following description of the embodiments, taken in conjunction with the accompanying drawings, in which.

DETAILED DESCRIPTION

Figure 1:
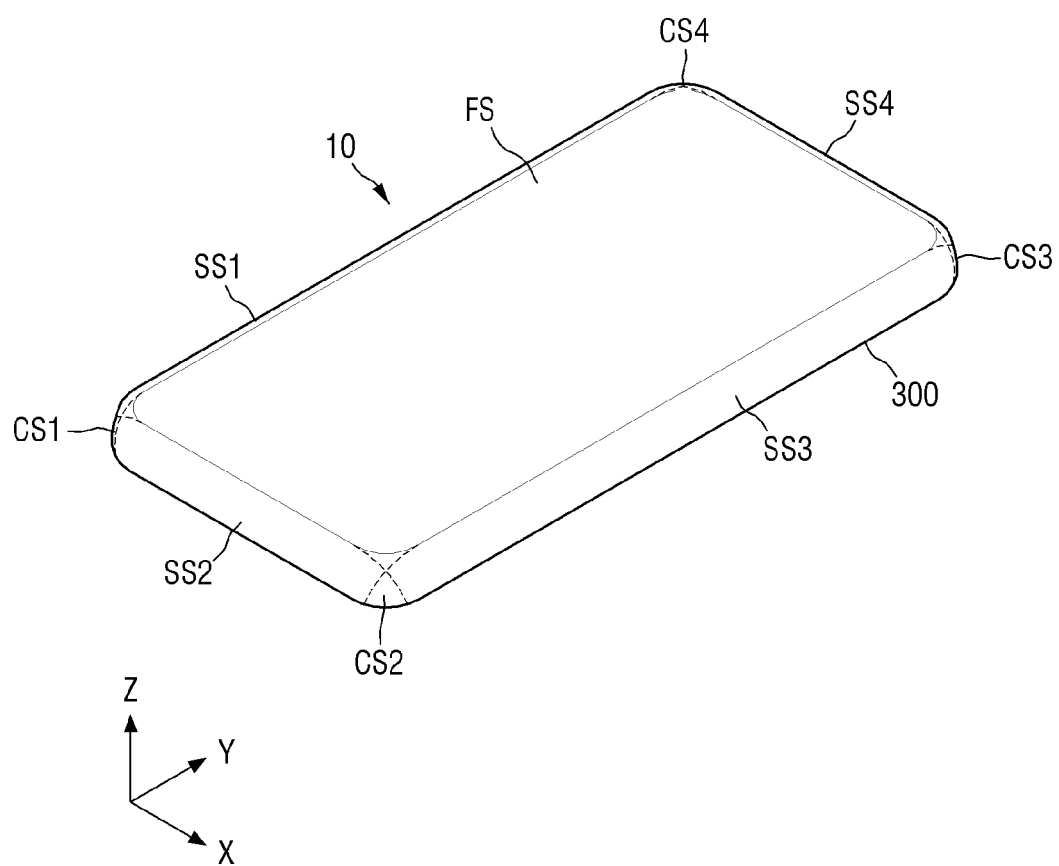
FIG. 1 is a perspective view of a display device according to an embodiment of the present disclosure.

Embodiments of the invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached drawing figures, the thickness of layers and regions is exaggerated for clarity.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will also be understood that when a layer is referred to as being "on" another layer or substrate, it can be directly on the other layer or substrate, or intervening layers may also be present. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. A region illustrated or described as flat may, typically, have rough and/or nonlinear features, for example. Moreover, sharp angles that are illustrated may be rounded. Thus, the regions illustrated in the drawing figures are schematic in nature and their shapes are not intended to illustrate the precise shape of a region and are not intended to limit the scope of the claims.

Hereinafter, embodiments of the invention will be described in detail with reference to the accompanying drawings.

Figure 2:
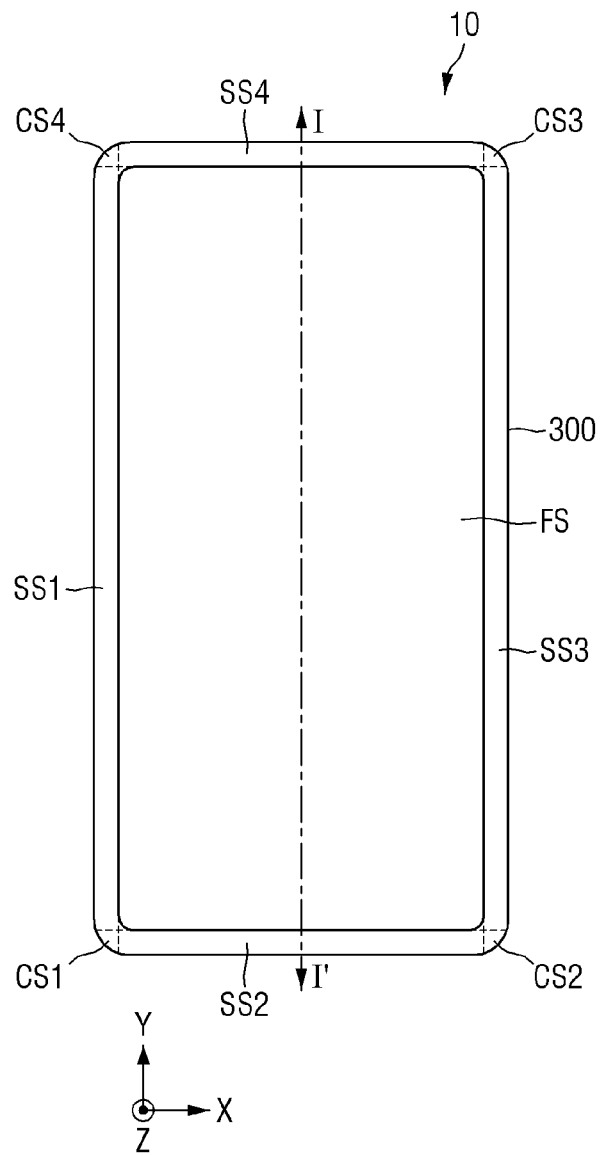
FIG. 2 is a plan view showing a display device according to an embodiment of the present disclosure.

FIG. 1 is a perspective view of a display device according to an embodiment of the present disclosure. FIG. 2 is a plan view showing a display device according to an embodiment of the present disclosure.

Referring to FIGS. 1 and 2, a display device 10 according to an embodiment of the present disclosure may be employed by portable electronic devices such as a mobile phone, a smart phone, a tablet PC, a mobile communications terminal, an electronic notebook, an electronic book, a portable multimedia player ("PMP"), a navigation device and an ultra-mobile PC ("UMPC"). Alternatively, the display device 10 according to an embodiment of the present disclosure may be used as a display unit of a television, a laptop computer, a monitor, an electronic billboard, or the Internet of Things ("IOT"). Alternatively, the display device 10 according to the embodiment of the present disclosure may be applied to wearable devices such as a smart watch, a watch phone, a glasses-type display, and a head-mounted display ("HMD") device. Alternatively, the display device 10 according to the embodiment may be used as a center information display ("CID") disposed at the instrument cluster, the center fascia or the dashboard of a vehicle, as a room mirror display on the behalf of the side mirrors of a vehicle, as a display placed on the back of each of the front seats that is an entertainment system for passengers at the rear seats of a vehicle.

As used herein, the first direction (x-axis direction) may be parallel to the shorter sides (i.e., latitudinal sides) of the display device 10, for example, the horizontal direction of the display device 10 when viewed from the top (See FIG. 2). The second direction (y-axis direction) may be parallel to the longer sides (i.e., longitudinal sides) of the display device 10, for example, the vertical direction of the display device 10 when viewed from the top (i.e., in a plan view). The third direction (z-axis direction) may refer to the thickness direction of the display device 10.

The display device 10 according to an embodiment may include a display panel 300. As shown in FIGS. 1 and 2, the display panel 300 may include a front surface portion FS, a first side surface portion SS1, a second side surface portion SS2, a third side surface portion SS3, a fourth side surface portion SS4, a first corner portion CS1, a second corner portion CS2, a third corner portion CS3, and a fourth corner portion CS4.

The display panel 300 may include a flexible substrate that can be bent, folded, or rolled. For example, the substrate SUB may be made of polyethersulphone ("PES"), polyacrylate ("PA"), polyacrylate ("PAR"), polyetherimide ("PEI"), polyethylene naphthalate ("PEN"), polyethylene terephthalate ("PET"), polyphenylene sulfide ("PPS"), polyallylate, polyimide ("PI"), polycarbonate ("PC"), cellulose triacetate ("CAT"), cellulose acetate propionate ("CAP") or a combination thereof. Alternatively, the substrate SUB may include a metallic material. In addition, only a part of the substrate SUB may be flexible, or the entire area of the substrate SUB may be flexible.

The front surface portion FS may have, but is not limited to, a rectangular shape having shorter sides (i.e., latitudinal sides) in the first direction (x-axis direction) and longer sides (i.e., longitudinal sides) in the second direction (y-axis direction) when viewed from the top. The front surface portion FS may have other polygonal shape, a circular shape or an oval shape when viewed from the top (i.e., in a plan view). Although the front surface portion FS is flat in the example shown in FIGS. 1 and 2, the present disclosure according to the invention is not limited thereto. In another embodiment, the front surface portion FS may include a curved surface.

The first side surface portion SS1 may be extended from a first side of the front surface portion FS. The first side surface portion SS1 may be bent along a first bending line BL1 (see FIG. 3) on the first side of the front surface portion FS and accordingly may have a first curvature. The first side of the front surface portion FS may be the left side of the front surface portion FS as shown in FIGS. 1 and 2.

The second side surface portion SS2 may be extended from a second side of the front surface portion FS. The second side surface portion SS2 may be bent along a second bending line BL2 (see FIG. 3) on the second side of the front surface portion FS and accordingly may have a second curvature. The second curvature may be different from the first curvature, but the present disclosure according to the invention is not limited thereto. In another embodiment, the second side of the front surface portion FS may be the lower side of the front surface portion FS as shown in FIGS. 1 and 2.

The third side surface portion SS3 may be extended from a third side of the front surface portion FS. The third side surface portion SS3 may be bent along a third bending line BL3 (see FIG. 3) on the third side of the front surface portion FS and accordingly may have a third curvature. The third curvature may be different from the second curvature, but the present disclosure according to the invention is not limited thereto. In another embodiment, the third side of the front surface portion FS may be the right side of the front surface portion FS as shown in FIGS. 1 and 2.

The fourth side surface portion SS4 may be extended from a fourth side of the front surface portion FS. The fourth side surface portion SS4 may be bent along a fourth bending line BL4 (see FIG. 3) on the fourth side of the front surface portion FS and accordingly may have a fourth curvature. The fourth curvature may be different from the first curvature, but the present disclosure according to the invention is not limited thereto. In another embodiment, the fourth side of the front surface portion FS may be the upper side of the front surface portion FS as shown in FIGS. 1 and 2.

The first corner portion CS1 may be located between the first side surface portion SS1 and the second side surface portion SS2. Specifically, the first corner portion CS1 may be in contact with the lower side of the first side surface portion SS1 and the left side of the second side surface portion SS2 (See FIG. 3). The first corner portion CS1 may have double curvature due to the first curvature of the first side surface portion SS1 and the second curvature of the second side surface portion SS2. Accordingly, a bending force by the first curvature of the first side surface portion SS1 and a bending force by the second curvature of the second side surface portion SS4, i.e., strain may be applied to the first corner portion CS1.

The second corner portion CS2 may be located between the second side surface portion SS2 and the third side surface portion SS3. Specifically, the second corner portion CS2 may be in contact with the right side of the second side surface portion SS2 and the lower side of the third side surface portion SS3. The second corner portion CS1 may have double curvature due to the second curvature of the second side surface portion SS2 and the third curvature of the third side surface portion SS3. Accordingly, a bending force by the second curvature of the second side surface portion SS2 and a bending force by the third curvature of the third side surface portion SS3, i.e., strain may be applied to the second corner portion CS2.

The third corner portion CS3 may be located between the third side surface portion SS3 and the fourth side surface portion SS4. Specifically, the third corner portion CS3 may be in contact with the upper side of the third side surface portion SS3 and the right side of the fourth side surface portion SS4. The third corner portion CS3 may have double curvature due to the third curvature of the third side surface portion SS3 and the fourth curvature of the fourth side surface portion SS4. Accordingly, a bending force by the third curvature of the third side surface portion SS3 and a bending force by the fourth curvature of the fourth side surface portion SS4, i.e., strain may be applied to the third corner portion CS3.

The fourth corner portion CS4 may be located between the first side surface portion SS1 and the fourth side surface portion SS4. Specifically, the fourth corner portion CS4 may be in contact with the upper side of the first side surface portion SS1 and the left side of the fourth side surface portion SS4. The fourth corner portion CS4 may have double curvature due to the first curvature of the first side surface portion SS1 and the fourth curvature of the fourth side surface portion SS4. Accordingly, a bending force by the first curvature of the first side surface portion SS1 and a bending force by the fourth curvature of the fourth side surface portion SS4, i.e., strain may be applied to the fourth corner portion CS4.

Each of the first corner portion CS1, the second corner portion CS2, the third corner portion CS3 and the fourth corner portion CS4 may include cut patterns that are separated by cut grooves in order to reduce the strain applied to the second display area DA2 (See FIG. 3) due to the double curvature. The cut patterns will be described later with reference to FIG. 5.

Figure 3:
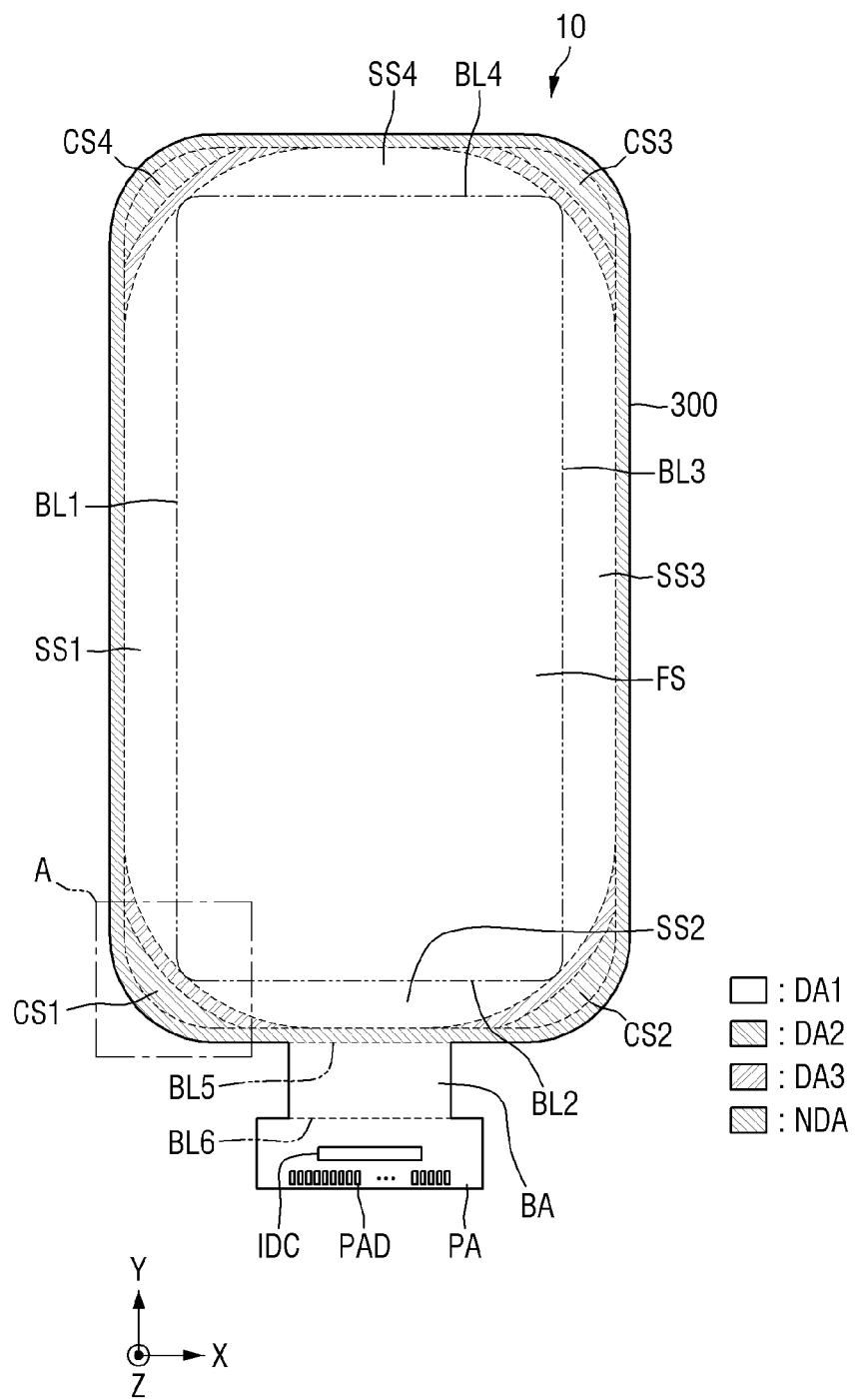
FIG. 3 is a development view showing a display device according to an embodiment of the present disclosure.

FIG. 3 is a development view showing a display device according to an embodiment of the present disclosure.

Referring to FIG. 3, the display panel 300 may further include a bending area BA and a pad area PA. The display panel 300 may include first to third display areas DA1 to DA3, a non-display area NDA, the bending area BA, and the pad area PA.

The first to third display areas DA1 to DA3 include pixels or emission areas to display images. The non-display area NDA does not include pixels or emission areas and does not display images. In the non-display area NDA, signal lines or driver circuits embedded in a panel for driving the pixels or the emission areas may be disposed.

The first display area DA1 may be the main display area of the display panel 300 and may include a front surface portion FS, a part of the first side surface portion SS1, a part of the second side surface portion SS2, a part of the third side part SS3 and a part of the side surface portion SS4. The part of the first side surface portion SS1 is extended from the first side of the front surface portion FS, and the part of the second side surface portion SS2 is extended from the second side of the front surface portion FS. The part of the third side surface portion SS3 is extended from the third side of the front surface portion FS, and the part of the fourth side surface portion SS4 is extended from the fourth side of the front surface portion FS. Each of the corner portions of the first display area DA1 may be rounded with a predetermined curvature.

Each of the second display areas DA2 may be a second auxiliary display area that assists the first display area DA1, i.e., the main display area. The resolution of each of the second display areas DA2 may be different from the resolution of the first display area DA1. For example, since each of the second display areas DA2 serves to assist the first display area DA1, the resolution of each of the second display areas DA2 may be lower than that of the first display area DA1. That is to say, the number of third emission areas per unit area in each of the second display areas DA2 may be smaller than the number of first emission areas per unit area in the first display area DA1. It is, however, to be understood that the present disclosure according to the invention is not limited thereto. In another embodiment, the resolution of each of the second display areas DA2 may be substantially equal to the resolution of the first display area DA1.

The second display areas DA2 may be disposed on the outer side of the third display areas DA3, respectively. Accordingly, the third display areas DA3 may be disposed between the first display areas DA1 and the second display areas DA2, respectively. At least a part of each of the second display areas DA2 may be disposed at the respective one of the corner portions CS1 to CS4. In addition, at least a part of each of the second display areas DA2 may be disposed at two of the first to fourth side surface portions SS1 to SS4.

For example, at least a part of the second display area DA2 disposed on the outer side of the corner portion where the lower side and the left side of the first display area DA1 meet may be disposed at the first corner portion CS1, the first side surface portion SS1 and the second side surface portion SS2. At least a part of the second display area DA2 disposed on the outer side of the corner portion where the lower side and the right side of the first display area DA1 meet may be disposed at the second corner portion CS, the second side surface portion SS2 and the third side surface portion SS3. At least a part of the second display area DA2 disposed on the outer side of the corner portion where the upper side and the right side of the first display area DA1 meet may be disposed at the third corner portion CS3, the third side surface portion SS3 and the fourth side surface portion SS4. At least a part of the second display area DA2 disposed on the outer side of the corner portion where the upper side and the left side of the first display area DA1 meet may be disposed at the fourth corner portion CS4, the first side surface portion SS1 and the fourth side surface portion SS4.

Each of the third display areas DA3 may be a second auxiliary display area that assists the first display area DA1, i.e., the main display area. The resolution of each of the third display areas DA3 may be different from the resolution of the first display area DA1. For example, since each of the third display areas DA3 serves to assist the first display area DA1, the resolution of each of the third display areas DA3 may be lower than that of the first display area DA1. That is to say, the number of second emission areas per unit area in each of the third display areas DA3 may be smaller than the number of first emission areas per unit area in the first display area DA1. It is, however, to be understood that the present disclosure according to the invention is not limited thereto. In another embodiment, the resolution of each of the third display areas DA3 may be substantially equal to the resolution of the first display area DA1.

Each of the third display areas DA3 may be disposed on the outer side of the respective one of the corner portions of the first display area DA1. At least a part of each of the third display areas DA3 may be disposed at the respective one of the corner portions CS1 to CS4. In addition, at least a part of each of the third display areas DA3 may be disposed on the front surface portion FS. In addition, at least a part of each of the third display areas DA3 may be disposed at two of the first to fourth side surface portions SS1 to SS4.

For example, at least a part of the third display area DA3 disposed on the outer side of the corner portion where the lower side and the left side of the first display area DA1 meet may be disposed at the front surface portion FS, the first corner portion CS1, the first side surface portion SS1 and the second side surface portion SS2. At least a part of the third display area DA3 disposed on the outer side of the corner portion where the lower side and the right side of the first display area DA1 meet may be disposed at the front surface portion FS, the second corner portion CS, the second side surface portion SS2 and the third side surface portion SS3. At least a part of the third display area DA3 disposed on the outer side of the corner portion where the upper side and the right side of the first display area DA1 meet may be disposed at the front surface portion FS, the third corner portion CS3, the third side surface portion SS3 and the fourth side surface portion SS4. At least a part of the third display area DA3 disposed on the outer side of the corner portion where the upper side and the left side of the first display area DA1 meet may be disposed at the front surface portion FS, the fourth corner portion CS4, the first side surface portion SS1 and the fourth side surface portion SS4.

The non-display area NDA may include the first side surface portion SS1, the second side surface portion SS2, the third side surface portion SS3, the fourth side surface portion SS4, the first corner portion CS1, the second corner portion CS2, the third corner portion CS3, and the fourth corner portion CS4. The non-display area NDA may be disposed on the outer sides of the first display area DA1 at the side surface portions SS1, SS2, SS3 and SS4. For example, the non-display area NDA may be disposed at the left edge of the first side surface portion SS1, the lower edge of the second side surface portion SS2, the right edge of the third side surface portion SS3, and the upper edge of the fourth side surface portion SS4.

The non-display area NDA may be disposed on the outer sides of the second display areas DA2 at the corner portions CS1, CS2, CS3 and CS4. For example, the non-display area NDA may be disposed at the edge of the corner portion where the upper side and the right side of the first corner portion CS1 meet, at the edge of the corner portion where the lower side and the right side of the second corner portion CS2 meet, at the edge of the corner portion where the upper side and the right side of the third corner portion CS3 meet, and at the edge of the corner portion where the upper side and the left side of the fourth corner portion CS4 meet.

The bending area BA may be extended from the lower side of the second side surface portion SS2. The bending area BA may be disposed between the second side surface portion SS2 and the pad area PA. The length of the bending area BA in the first direction (x-axis direction) may be smaller than the length of the second side surface portion SS2 in the first direction (x-axis direction). The bending area BA may be bent along a fifth bending line BL5 on the lower side of the second side surface portion SS2.

The pad area PA may be extended from the lower side of the bent area BA. The length of the pad area PA in the first direction (x-axis direction) may be larger than the length of the bending area BA in the first direction (x-axis direction). It is, however, to be understood that the present disclosure according to the invention is not limited thereto. In another embodiment, the length of the pad area PA in the first direction (x-axis direction) may be substantially equal to the length of the bending area BA in the first direction (x-axis direction). The pad area PA may be bent along a sixth bending line BL6 on the lower side of the bending area BA. The pad area PA may be disposed on the lower side of the front surface portion FS.

An integrated driver circuit IDC and the pads PAD may be disposed on the pad area PA. The integrated driver circuit IDC may be implemented as an integrated circuit ("IC"). The integrated driver circuit IDC may be attached on the pad area PA by a chip on glass ("COG") technique, a chip on plastic ("COP") technique, or an ultrasonic bonding. Alternatively, the integrated driver circuit IDC may be disposed on a circuit board disposed on the pads PADs of the pad area PA.

The integrated driver IDC may be electrically connected to the pads PADs of the pad area PA. The integrated driver circuit IDC may receive digital video data and timing signals through the pads PADs of the pad area PA. The integrated driver circuit IDC may convert digital video data into analog data voltages and output them to the data lines of the display areas DA1, DA2, and DA3.

The circuit board may be attached on the pads PADs of the pad area PA using an anisotropic conductive film. For this reason, the pads PADs of the pad area PA may be electrically connected to the circuit board.

As shown in FIG. 3, the display areas DA1, DA2 and DA3 may be disposed at the front surface portion FS, the first side surface portion SS1, the second side surface portion SS2, the third side surface portion SS3, the fourth side surface portion SS4, the first corner portion CS1, the second corner portion CS2, the third corner portion CS3, and the fourth corner portion CS4. Therefore, images can be displayed not only on the front side FS, the first side surface portion SS1, the second side surface portion SS2, the third side surface portion SS3 and the fourth side surface portion SS4, but also on the first corner portion CS1, the second corner portion CS2, the third corner portion CS3 and the fourth corner portion CS4.

Figure 4:
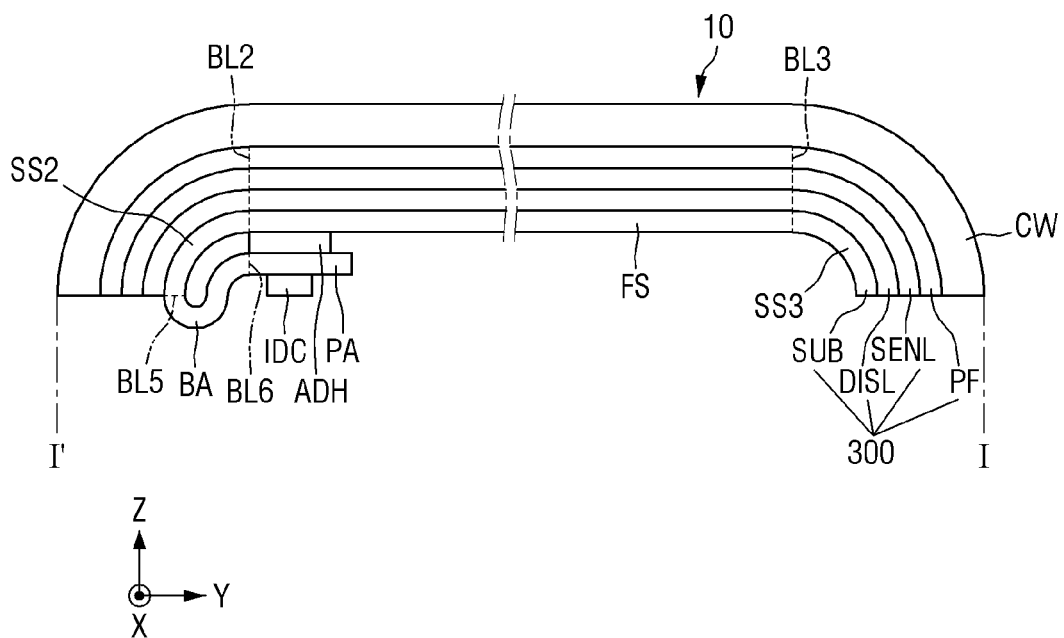
FIG. 4 is a cross-sectional view showing a display device according to an embodiment of the present disclosure.

FIG. 4 is a cross-sectional view showing a display device according to an embodiment of the present disclosure. FIG. 4 shows an example of the display device 10, and a cross-sectional view taken along line I-I' of FIG. 2.

Referring to FIG. 4, the display panel 300 may include a substrate SUB, a display layer DISL, a sensor electrode layer SENL, a polarizing film PF, and/or a cover window CW.

The display layer DISL may be disposed on the substrate SUB. The display layer DISL may include the display areas DA1, DA2 and DA3 (see FIG. 3) and the non-display area NDA. In addition to the emission areas, scan lines, data lines, power lines, etc. for driving light-emitting elements may be disposed in the display area DA of the display layer DISL. In the non-display area NDA of the display layer DISL, a scan driver circuit outputting scan signals to the scan lines, fan-out lines connecting the data lines with the integrated driver circuit IDC, etc. may be disposed.

Figure 7:
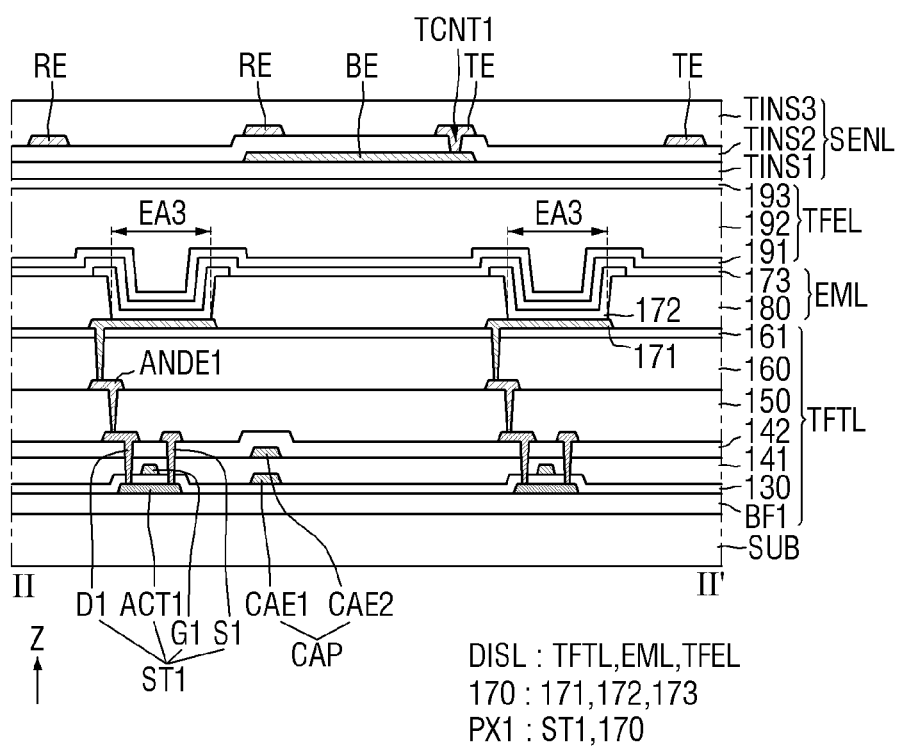
FIG. 7 is a cross-sectional view showing an example of a display panel taken along line II-II' of FIG. 6.

The display layer DISL may include a thin-film transistor layer TFTL in which thin-film transistors are disposed, an emission material layer EML in which light-emitting elements emitting light are disposed in the emission areas, and an encapsulation layer TFEL for encapsulating the emission material layer, as shown in FIG. 7.

The sensor electrode layer SENL may be disposed on the display layer DISL. The sensor electrode layer SENL may include sensor electrodes. The sensor electrode layer SENL can sense whether there is a touch of a person or an object using the sensor electrodes.

The polarizing film PF may be disposed on the sensor electrode layer SENL. The polarizing film PF may include a first base member, a linear polarizer, a retardation film such as a λ/4 (quarter-wave) plate, a λ/2 (half-wave) plate, and a second base member. For example, the first base member, the linear polarizer, the λ/4 plate, the λ/2 plate, and the second base member may be sequentially stacked on the sensor electrode layer SENL.

The cover window CW may be disposed on the polarizing film PF. The cover window CW may be attached on the polarizing film PF by a transparent adhesive member such as an optically clear adhesive ("OCA") film and an optically clear resin ("OCR"). The cover window CW may be either an inorganic material such as glass or an organic material such as plastic and polymer material.

The bending area BA may be bent along the fifth bending line BL5 and may be disposed on the lower surface of the second side surface portion SS2. The pad area PA may be bent along the sixth bending line BL6 and disposed on the lower surface of the front surface portion FS. The pad area PA may be attached to the lower surface of the front surface portion FS by an adhesive member ADH. The adhesive member ADH may be a pressure sensitive adhesive.

Figure 5:
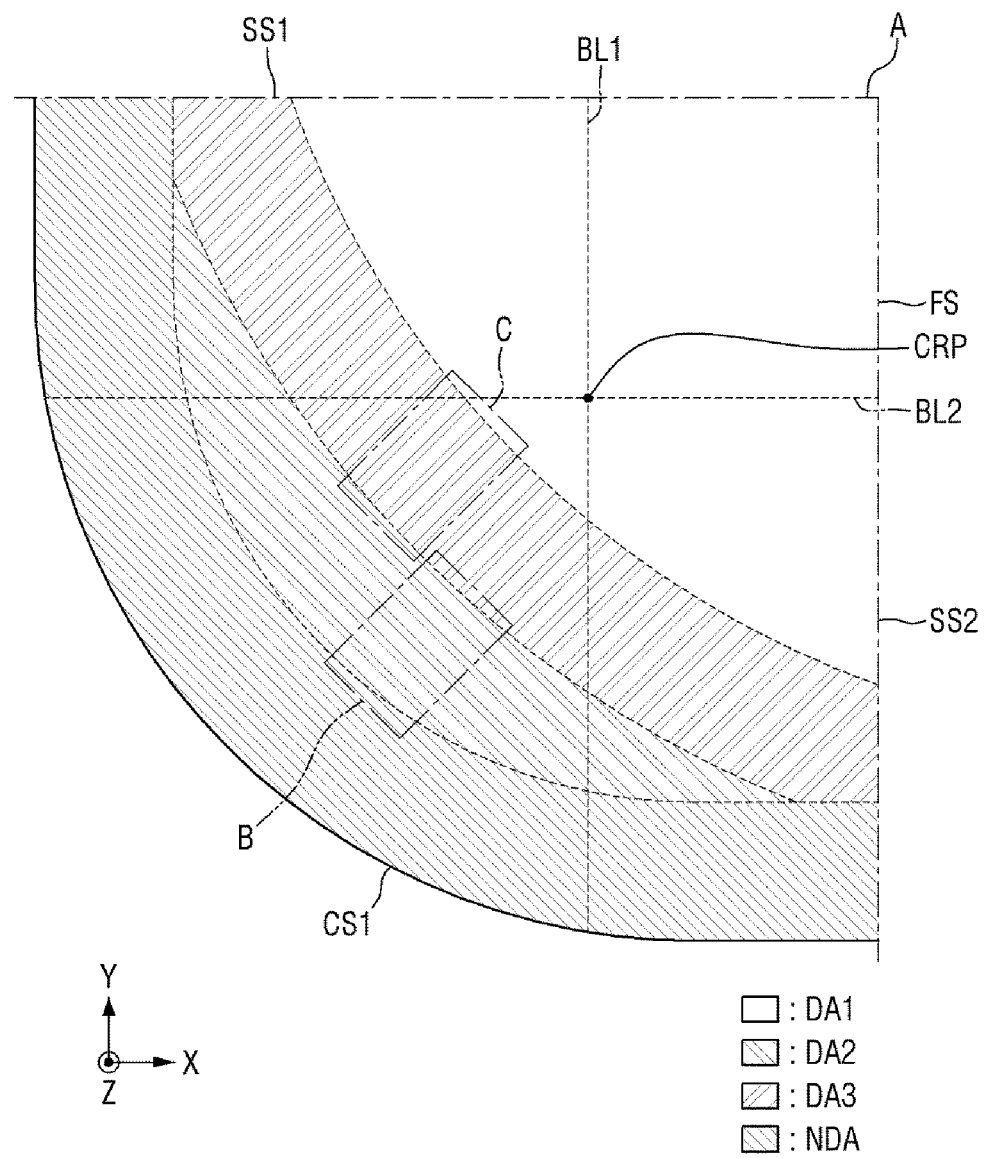
FIG. 5 is a layout diagram showing the first to third display areas and the non-display area disposed at the first corner portion of the display panel according to the embodiment of the present disclosure.

FIG. 5 is a layout diagram showing the first to third display areas and the non-display area disposed at the first corner portion of the display panel according to the embodiment of the present disclosure. FIG. 5 is an enlarged view of area A of FIG. 3.

Referring to FIG. 5, a cross point CRP of the first bending line BL1 and the second bending line BL2 may be located in the first display area DA1. In such case, the first display area DA1 may be disposed on the front surface portion FS, the first side surface portion SS1, the second side surface portion SS2 and the first corner portion CS1. The third display area DA3 may be disposed on the first side surface portion SS1, the second side surface portion SS2, and the first corner portion CS1. The second display area DA2 may be disposed on the first side surface portion SS1, the second side surface portion SS2, and the first corner portion CS1. The non-display area NDA may be disposed on the first side surface portion SS1, the second side surface portion SS2, and the first corner portion CS1.

The position of the cross point CRP of the first bending line BL1 and the second bending line BL2 is not limited to that shown in FIG. 5 but may be located in the second display area DA2 or the third display area DA3.

Figure 6:
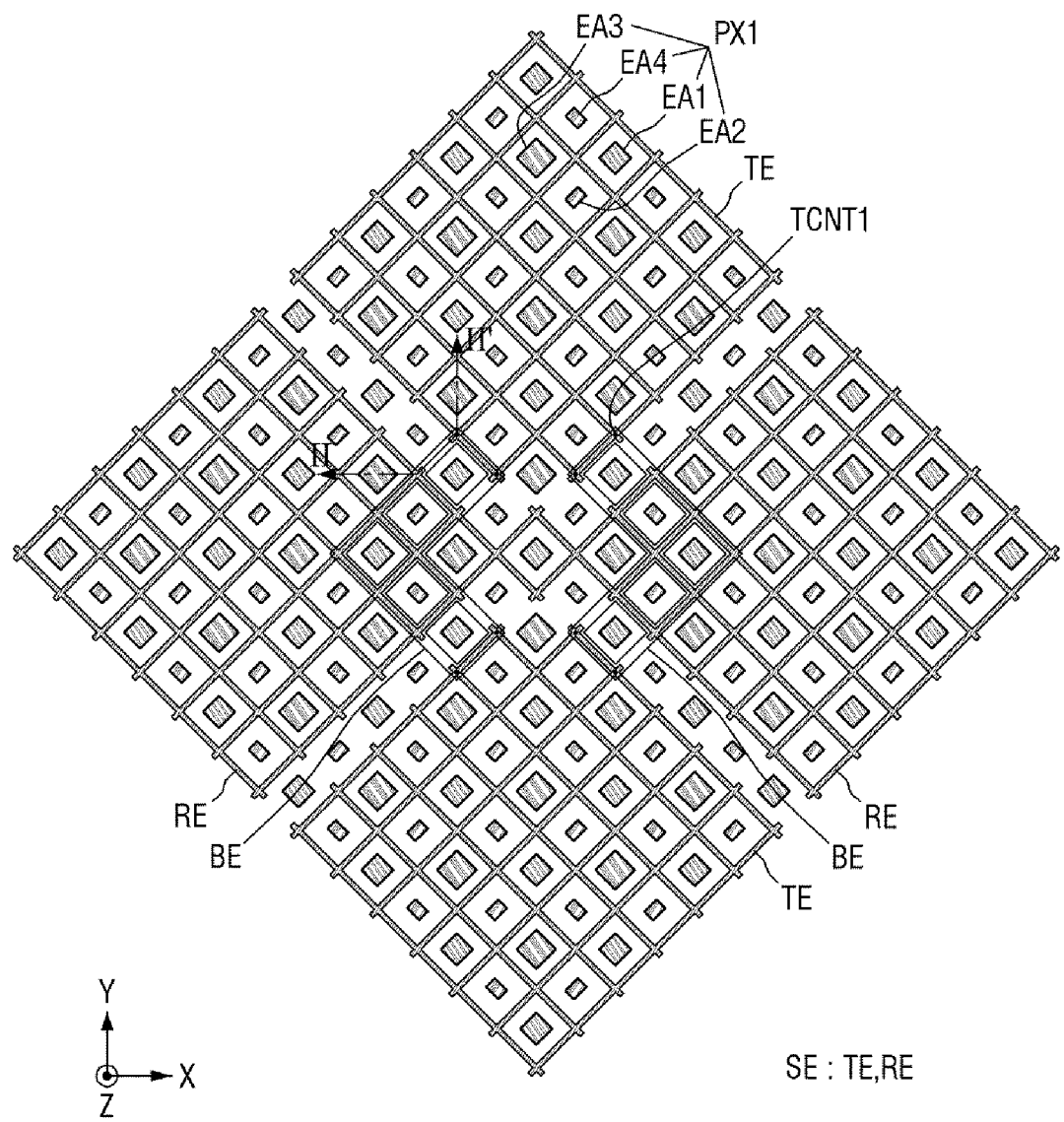
FIG. 6 is a layout diagram showing an example of the first display area of FIG. 5.

The first display area DA1 may include first pixels PX1 that display an image (see FIG. 6). In addition, the first display area DA1 may include sensor electrodes SE for sensing a user's touch (see FIG. 7). The sensor electrodes SE may include driving electrodes TE and sensing electrodes RE (see FIG. 7).

Figure 8:
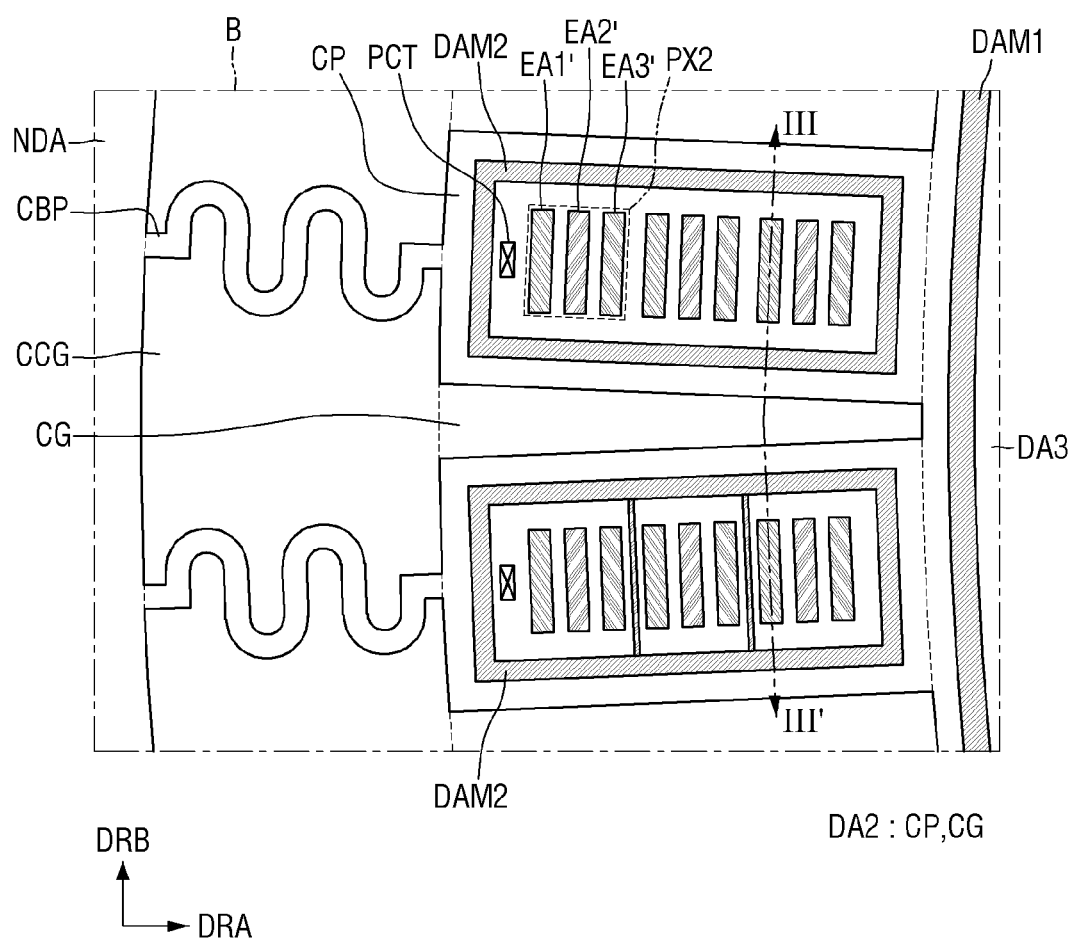
FIG. 8 is a layout diagram showing an example of the second display area of FIG. 5.
Figure 9:
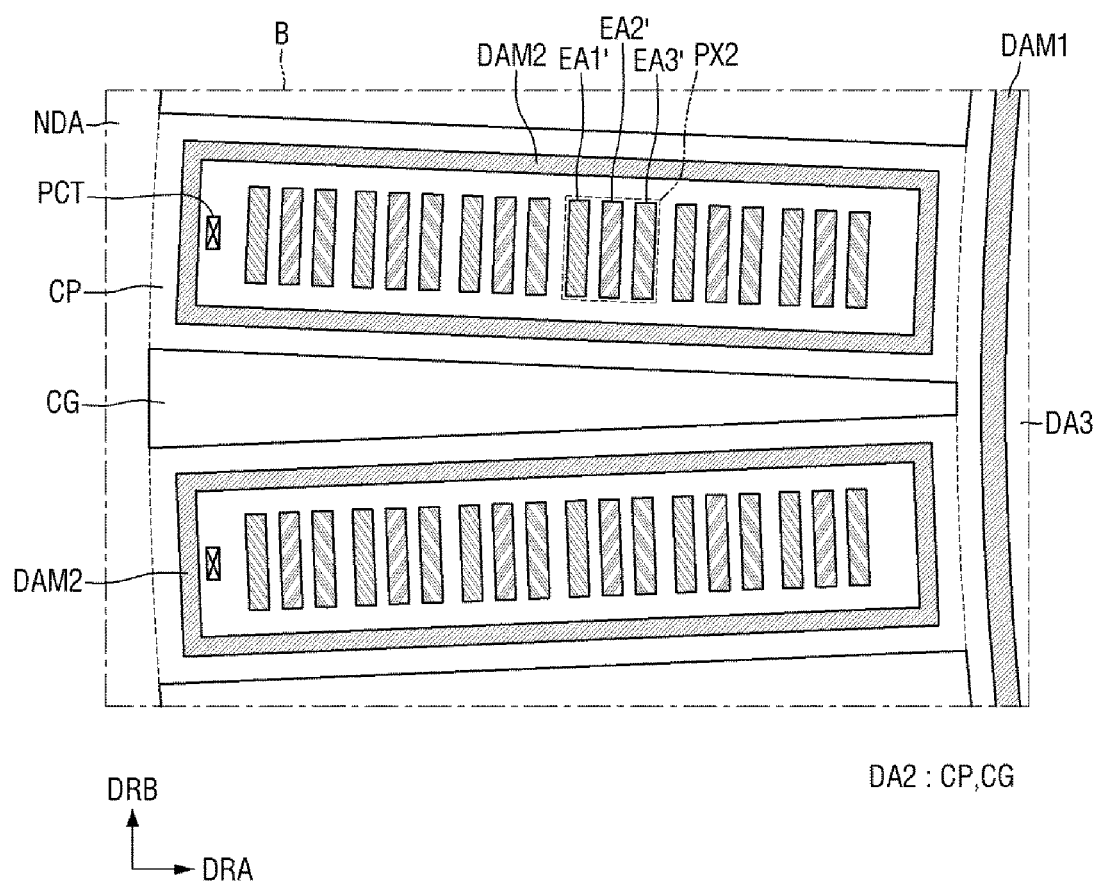
FIG. 9 is a layout diagram showing yet another example of the second display area of FIG. 5.
Figure 10:
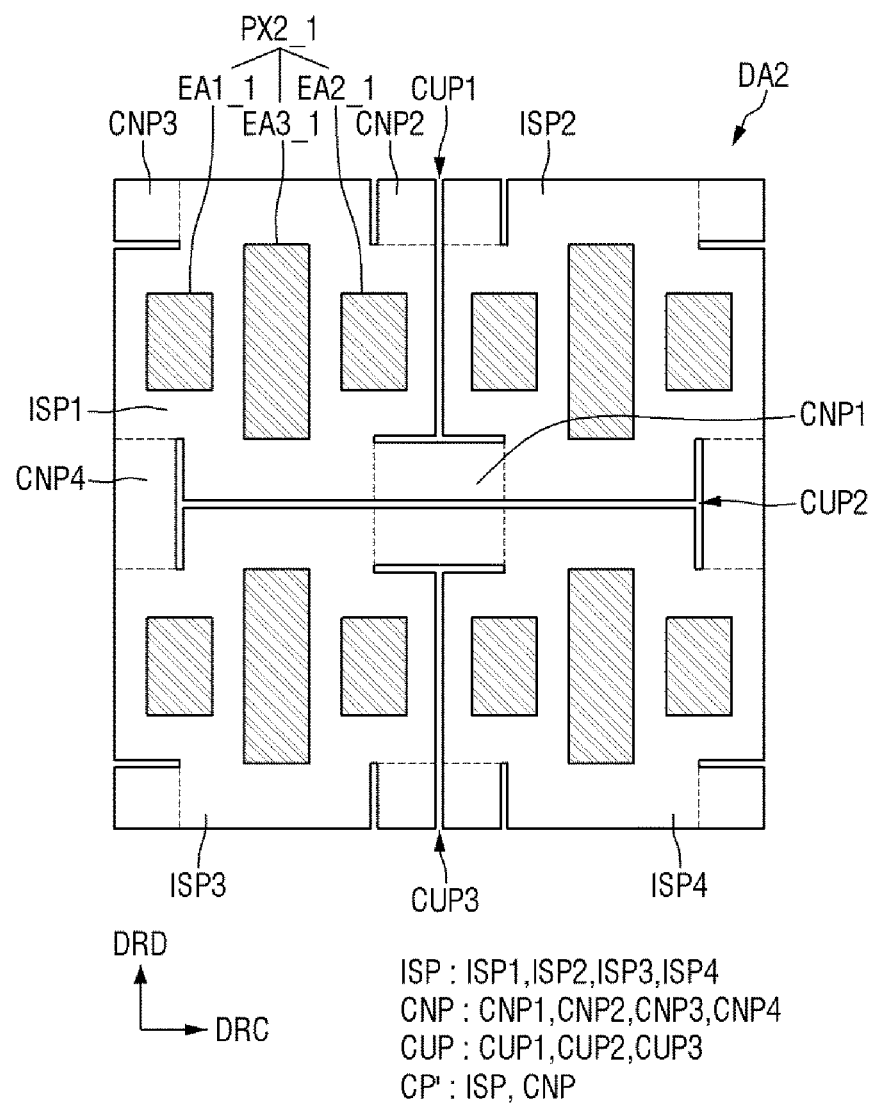
FIGS. 10 and 11 are layout diagrams showing yet another example of the second display area of FIG. 5.
Figure 11:
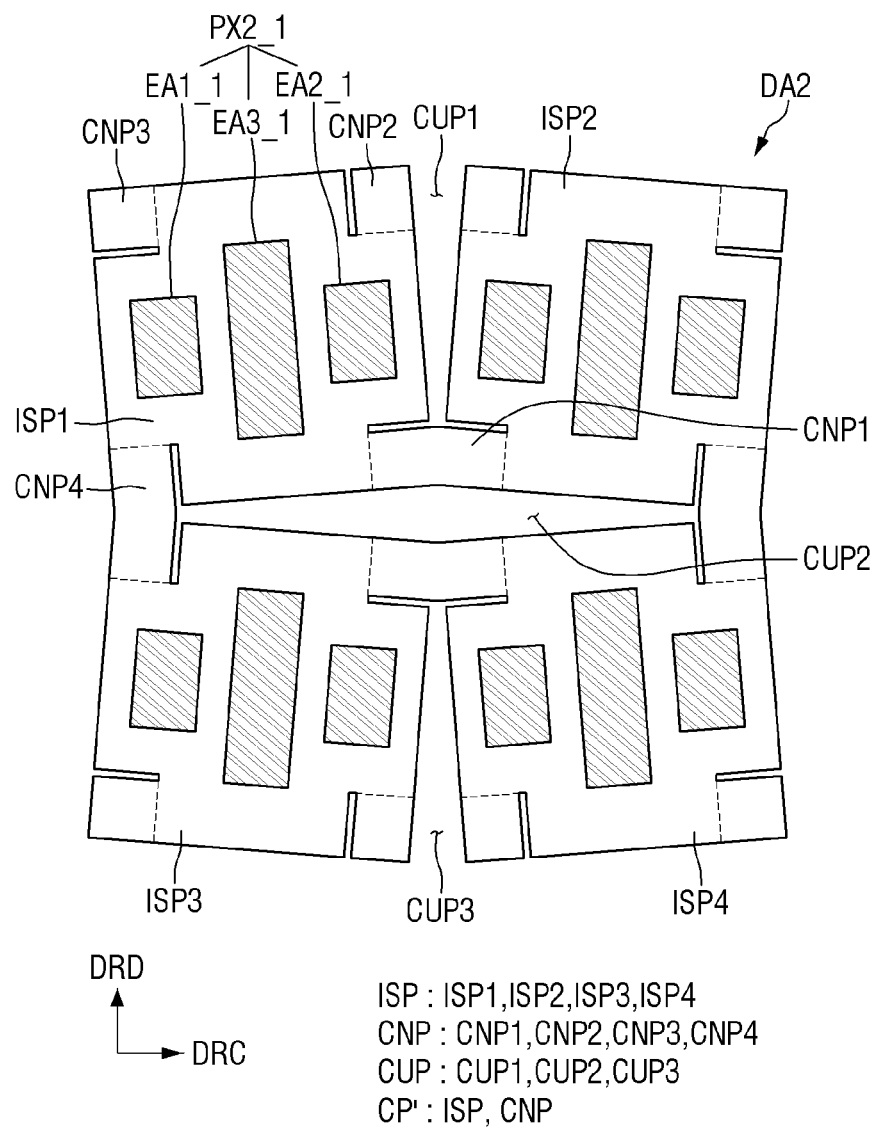

The second display area DA2 may be disposed on the outer side of the third display area DA3. The non-display area NDA may be disposed on the outer side of the second display area DA2. The second display area DA2 may include second pixels PX2 that display an image (see FIGS. 8 to 11). In order to reduce the strain due to the double curvature of the first corner portion CS1, the first corner portion CS1 may include cut patterns CP and cutout grooves CG, as shown in FIGS. 8 and 9. Alternatively, in order to reduce the strain due to the double curvature of the first corner portion CS1, the first corner portion CS1 may include cut patterns CP' and cutouts CUP, as shown in FIGS. 10 and 11. As used herein, the cutout CUP and the cut groove CG are collectively referred as "cut portion".

The third display area DA3 may be disposed on the outer side of the first display area DA1. The third display area DA3 may include third pixels PX3 that display an image (see FIG. 14).

If a non-display area is formed instead of the third display area DA3, a user may recognize the non-display area between the first display area DA1 and the second display area DA2. In other words, the user may recognize a gap between the image displayed by the first display area DA1 and the image displayed by the second display area DA2. In contrast, when the third display area DA3 including third pixels PX3 (see FIG. 14) is formed between the first display area DA1 and the second display area DA2, it is possible to prevent a gap between the image displayed by the first display area DA1 and the image displayed by the second display area DA2 from being seen by the user.

The display areas DA1, DA2 and DA3 and the non-display area NDA disposed at the second corner portion CS2, the third corner portion CS3 and the fourth corner portion CS4 shown in FIG. 3 may be similar to those described above with respect to FIG. 5. Therefore, the second corner portion CS2, the third corner portion CS3 and the fourth corner portion CS4 will not be described.

FIG. 6 is a layout diagram showing an example of the first display area of FIG. 5.

FIG. 6 shows the first pixels PX1 of the first display area DA1 and the driving electrodes TE and the sensing electrodes RE of the sensor electrode layer SENL (see FIG. 4). In the example shown in FIG. 6, a user's touch is sensed by mutual capacitive sensing by using two kinds of sensor electrodes, i.e., driving electrodes TE and sensing electrodes RE. For convenience of illustration, FIG. 6 shows only two sensing electrodes RE adjacent to each other in the first direction (x-axis direction) and two driving electrodes TE adjacent to each other in the second direction (Y-axis direction).

Referring to FIG. 6, the driving electrodes TE may be electrically separated from the sensing electrodes RE. The driving electrodes TE and the sensing electrodes RE are disposed on the same layer and thus they may be spaced apart from each other. There may be a gap between the driving electrodes TE and the sensing electrodes RE.

The sensing electrodes RE may be electrically connected to one another in the first direction (x-axis direction). The driving electrodes TE may be electrically connected to one another in the second direction (y-axis direction). In order to electrically separate the sensing electrodes RE from the driving electrodes TE at their intersections, the driving electrodes TE adjacent to one another in the second direction (y-axis direction) may be connected through touch connection electrodes BE.

The touch connection electrodes BE may be disposed on a different layer from the driving electrodes TE and the sensing electrodes RE and may be connected to the driving electrodes TE through first touch contact holes TCNT1. One end of each of the touch connection electrodes BE may be connected to one of the driving electrodes TE adjacent to each other in the second direction (y-axis direction) through the first touch contact hole TCNT1. The other end of each of the touch connection electrodes BE may be connected to another one of the driving electrodes TE adjacent to each other in the second direction (y-axis direction) through the first touch contact hole TCNT1. The touch connection electrodes BE may overlap the sensing electrodes RE in the third direction (z-axis direction). Since the touch connection electrodes BE are disposed on a different layer from the driving electrodes TE and the sensing electrodes RE, they can be electrically separated from the sensing electrodes RE even though they overlap the sensing electrodes RE in the third direction (i.e., z-axis direction, in a plan view).

Each of the touch connection electrodes BE may be bent at least once. Although the touch connection electrodes BE are bent in the shape of angle brackets "<" or ">" in the example shown in FIG. 6, the shape of the touch connection electrodes BE according to the invention is not limited thereto. In addition, since the driving electrodes TE adjacent to each other in the second direction (y-axis direction) are connected by the plurality of touch connection electrodes BE, even if any of the touch connection electrodes BE is disconnected, the driving electrodes TE can still be electrically connected with each other.

Each of the driving electrodes TE and the sensing electrodes RE may have a mesh structure when viewed from the top (i.e., in a plan view). Since the driving electrodes TE and the sensing electrodes RE are disposed on the thin-film encapsulation layer TFEL (see FIG. 7), the distance from a common electrode 173 (see FIG. 7) to the driving electrode TE or the sensing electrode RE is small. Therefore, a parasitic capacitance may be formed between the common electrode 173 (see FIG. 7) and the driving electrode TE or the sensing electrode RE. The parasitic capacitance is proportional to the area where the common electrode 173 (see FIG. 7) and the driving electrode TE or the sensing electrode RE overlaps each other in a plan view. In order to reduce such parasitic capacitance, it is desired that the driving electrodes TE and the sensing electrodes RE have a mesh structure when viewed from the top (i.e., in a plan view).

The first display area DA1 may include the first pixels PX1 for displaying an image. Each of the first pixels PX1 may include a plurality of emission areas EA1, EA2, EA3 and EA4. For example, each of the first pixels PX1 may include a first emission area EA1, a second emission area EA2, a third emission area EA3, and a fourth emission area EA4. The first emission area EA1 refers to an emission area of a first sub-pixel that emits a first light, and the second emission area EA2 refers to an emission area of a second sub-pixel that emits a second light. The third emission area EA3 refers to an emission area of a third sub-pixel that emits a third light, and the fourth emission area EA4 refers to an emission area of a fourth sub-pixel that emits a fourth light.

The first emission area EA1, the second emission area EA2, the third emission area EA3 and the fourth emission area EA4 may emit lights of different colors. Alternatively, two of the first emission area EA1, the second emission area EA2, the third emission area EA3 and the fourth emission area EA4 may emit light of the same color. For example, the first emission area EA1 may emit light of red color, the second emission area EA2 and the fourth emission area EA4 may emit light of green color, and the third emission area EA3 may emit light of blue color.

Each of the first emission area EA1, the second emission area EA2, the third emission area EA3 and the fourth emission area EA4 may have, but is not limited to, a quadrangular shape such as a diamond when viewed from the top. For example, the first emission area EA1, the second emission area EA2, the third emission area EA3 and the fourth emission area EA4 may have other polygonal shape than a quadrangular shape, a circular shape, or an elliptical shape when viewed from the top (i.e., in a plan view). In the example shown in FIG. 6, the third emission area EA3 has the largest area, the first emission area EA1 has the second largest area, and the second emission area EA2 and the fourth emission area EA4 have the smallest area. It is, however, to be understood that the present disclosure according to the invention is not limited thereto.

Since the driving electrodes TE, the sensing electrodes RE and the touch connection electrodes BE are formed in a mesh structure when viewed from the top (i.e., in a plan view), the emission area EA1, EA2, EA3 and EA4 may not overlap the driving electrodes TE, the sensing electrodes RE and the touch connection electrodes BE in the third direction (z-axis direction). As a result, the light emitted from the emission areas EA1, EA2, EA3 and EA4 is not or less blocked by the driving electrodes TE, the sensing electrodes RE and the touch connection electrodes BE, and thus it is possible to avoid or reduce the luminance of the light from being lowered by the electrodes.

FIG. 7 is a cross-sectional view showing an example of a display panel taken along line II-II' of FIG. 6.

Referring to FIG. 7, the display layer DISL including the thin-film transistor layer TFTL, an emission material layer EML, and an encapsulation layer TFEL may be disposed on the substrate SUB, and the sensor electrode layer SENL including the driving electrodes TE, the sensing electrodes RE and the touch connection electrodes BE may be disposed on the display layer DISL.

The substrate SUB may be made of an insulating material such as a polymer resin and glass. For example, the substrate SUB may include polyimide. In such case, the substrate SUB may be a flexible substrate that can be bent, folded, or rolled.

The thin-film transistor layer TFTL including first thin-film transistors ST1 may be disposed on the substrate SUB. The thin-film transistor layer TFTL may include a first thin-film transistor ST1, a pixel connection electrode ANDE1, a buffer layer BF1, a gate insulator 130, a first interlayer-dielectric layer 141, a second interlayer-dielectric layer 142, a first planarization layer 150, and a second planarization layer 160.

The buffer layer BF1 may be disposed on the substrate SUB. The buffer layer BF1 may be formed of or include a silicon nitride layer, a silicon oxynitride layer, a silicon oxide layer, a titanium oxide layer, or an aluminum oxide layer.

The first thin-film transistor ST1 may be disposed on the buffer layer BF1. The first thin-film transistor ST1 may include a first active layer ACT1, a first gate electrode G1, a first source electrode S1, and a first drain electrode D1.

The first active layer ACT1 of the first thin-film transistor ST1 may be disposed on the buffer layer BF1. The first active layer ACT1 may include silicon semiconductor such as polycrystalline silicon, monocrystalline silicon, low-temperature polycrystalline silicon and amorphous silicon. The part of the first active layer ACT1 overlapping the first gate electrode G1 in the third direction (i.e., z-axis direction, in a plan view) may be defined as a channel region. The other parts of the first active layer ACT1 not overlapping the first gate electrode G1 in the third direction (z-axis direction) may be defined as conductive regions. The conductive regions of the first active layer ACT1 may have conductivity by doping a silicon semiconductor with ions or impurities.

A gate insulator 130 may be disposed on the first active layer ACT of the first thin-film transistor ST1. The gate insulator 130 may be formed of or include an inorganic layer, for example, a silicon nitride layer, a silicon oxynitride layer, a silicon oxide layer, a titanium oxide layer, or an aluminum oxide layer.

The first gate electrode G1 of the first thin-film transistor ST1 and a first capacitor electrode CAE1 may be disposed on the gate insulator 130. The first gate electrode G1 of the first thin-film transistor ST1 may overlap the first active layer ACT1 in the third direction (i.e., z-axis direction, in a plan view). The first capacitor electrode CAE1 may overlap the second capacitor electrode CAE2 in the third direction (z-axis direction). The first gate electrode G1 and the first capacitor electrode CAE1 may be a single layer or multiple layers of one of molybdenum (Mo), aluminum (Al), chromium (Cr), gold (Au), titanium (Ti), nickel (Ni), neodymium (Nd) and copper (Cu) or an alloy thereof.

The first interlayer-dielectric layer 141 may be disposed on the first gate electrode G1 and the first capacitor electrode CAE1. The first interlayer-dielectric layer 141 may be formed of or include an inorganic layer, for example, a silicon nitride layer, a silicon oxynitride layer, a silicon oxide layer, a titanium oxide layer, or an aluminum oxide layer. The first interlayer-dielectric layer 141 may include a number of inorganic layers.

The second capacitor electrode CAE2 may be disposed on the first interlayer-dielectric layer 141. The second capacitor electrode CAE2 may overlap the first capacitor electrode CAE1 in the third direction (i.e., Z-axis direction, in a plan view). Since the first interlayer-dielectric layer 141 has a predetermined dielectric constant, a capacitor can be formed by the first capacitor electrode CAE1, the second capacitor electrode CAE2 and the first interlayer-dielectric layer 141. The second capacitor electrode CAE2 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

A second interlayer-dielectric layer 142 may be disposed over the second capacitor electrode CAE2. The second interlayer-dielectric layer 142 may be formed of or include an inorganic layer, for example, a silicon nitride layer, a silicon oxynitride layer, a silicon oxide layer, a titanium oxide layer, or an aluminum oxide layer.

The first source electrode S1 and the first drain electrode D1 of the first thin-film transistor ST1 may be disposed on the second interlayer-dielectric layer 142. The first source electrode S1 and the first drain electrode D1 may be made up of a single layer of one of molybdenum (Mo), aluminum (Al), chromium (Cr), gold (Au), titanium (Ti), nickel (Ni), neodymium (Nd) and copper (Cu) or an alloy thereof, or multiple layers thereof.

The first source electrode S1 of the first thin-film transistor ST1 may be connected to the conductive region located on a side of the change region of the first active layer ACT1 through a contact hole penetrating through the gate insulator 130, the first interlayer-dielectric layer 141 and the second interlayer-dielectric layer 142. The first drain electrode D1 of the first thin-film transistor ST1 may be connected to the conductive region located on the opposite side of the change region of the first active layer ACT1 through a contact hole penetrating through the gate insulator 130, the first interlayer-dielectric layer 141 and the second interlayer-dielectric layer 142.

The first planarization layer 150 may be disposed on the first source electrode S1 and the first drain electrode D1 to provide a flat surface over the thin-film transistors having different levels. The first planarization layer 150 may be formed of or include an organic layer such as an acryl resin, an epoxy resin, a phenolic resin, a polyamide resin and a polyimide resin.

The pixel connection electrode ANDE1 may be disposed on the first planarization layer 150. The pixel connection electrode ANDE1 may be connected to the first source electrode S1 or the first drain electrode D1 of the first thin-film transistor ST1 through a contact hole penetrating the first planarization layer 150. The pixel connection electrode ANDE1 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The second planarization layer 160 may be disposed on the pixel connection electrode ANDE1. The second planarization layer 160 may be formed of or include an organic layer such as an acryl resin, an epoxy resin, a phenolic resin, a polyamide resin and a polyimide resin.

A barrier layer 161 may be disposed on the second planarization layer 160. The barrier layer 161 may be formed of or include a silicon nitride layer, a silicon oxynitride layer, a silicon oxide layer, a titanium oxide layer, or an aluminum oxide layer.

The emission material layer EML is disposed on the thin-film transistor layer TFTL. The emission material layer EML may include first light-emitting elements 170 and a bank 180.

Each of the first light-emitting elements 170 may include a first pixel electrode 171, a first emissive layer 172, and a first common electrode 173. In each of the emission areas EA1, EA2, E3 and E4, the first pixel electrode 171, the first emissive layer 172 and the first common electrode 173 are stacked on one another sequentially, so that holes from the first pixel electrode 171 and electrons from the first common electrode 173 are combined with each other in the first emissive layer 172 to emit light. In such case, the first pixel electrode 171 may be an anode electrode while the first common electrode 173 may be a cathode electrode. The first emission area EA1, the second emission area EA2 and the fourth emission area EA4 may be substantially identical to the third emission area EA3 shown in FIG. 7.

The first pixel electrode 171 may be disposed on the barrier layer 161. The first pixel electrode 171 may be connected to the pixel connection electrode ANDE1 through a contact hole penetrating the barrier layer 161 and the second planarization layer 160.

In the top-emission structure where light exits from the first emissive layer 172 toward the first common electrode 173, the first pixel electrode 171 may be made up of a single layer of molybdenum (Mo), titanium (Ti), copper (Cu) or aluminum (Al), or may be made up of a stack structure of aluminum and titanium (Ti/Al/Ti), a stack structure of aluminum and ITO ("ITO"/Al/ITO), an Ag—Pd—Cu ("APC") alloy and a stack structure of APC alloy and ITO (ITO/APC/ITO) in order to increase the reflectivity. The APC alloy is an alloy of silver (Ag), palladium (Pd) and copper (Cu).

The bank 180 serves to define each of the emission areas E1, E2, E3 and E4 of display pixels. To this end, the bank 180 may be disposed on the barrier layer 161 to expose a part of the first pixel electrode 171. The bank 180 may cover the edge of the first pixel electrode 171. The bank 180 may be disposed in a contact hole penetrating through the barrier layer 161 and the second planarization layer 160. Accordingly, the contact hole penetrating the barrier layer 161 and the second planarization layer 160 may be filled with the bank 180. The bank 180 may be formed of or include an organic layer such as an acryl resin, an epoxy resin, a phenolic resin, a polyamide resin and a polyimide resin.

The first emissive layer 172 is disposed on the first pixel electrode 171. The first emissive layer 172 may include an organic material and emit light of a predetermined color. For example, the first emissive layer 172 may include a hole transporting layer, an organic material layer, and an electron transporting layer. The organic material layer may include a host and a dopant. The organic material layer may include a material that emits a predetermined light, and may be formed using a phosphor or a fluorescent material.

The first common electrode 173 is disposed on the first emissive layer 172. The first common electrode 173 covers the first emissive layer 172. The first common electrode 173 may be a common layer disposed across the display pixels. A capping layer may be disposed on the second electrode 173.

In the top-emission structure, the first common electrode 173 may be formed of or include a transparent conductive material ("TCP") such as ITO and IZO that can transmit light, or a semi-transmissive conductive material such as magnesium (Mg), silver (Ag) and an alloy of magnesium (Mg) and silver (Ag). When the first common electrode 173 is formed of or include a semi-transmissive conductive material, the light extraction efficiency can be increased by using microcavities.

The encapsulation layer TFEL may be disposed on the emission material layer EML. The encapsulation layer TFEL may include at least one inorganic layer to prevent permeation of oxygen or moisture into the light-emitting element layer EML. In addition, the encapsulation layer TFEL may include at least one organic layer to protect the emission material layer EML from particles.

For example, the thin-film encapsulation layer TFEL may include a first inorganic encapsulation layer 191 disposed on the first common electrode 173, an organic encapsulation layer 192 disposed on the first inorganic encapsulation layer 191, and a second inorganic encapsulation layer 193 disposed on the organic encapsulation layer 192. The first inorganic encapsulation layer 191 and the second inorganic encapsulation layer 193 may be made up of multiple layers in which one or more inorganic layers of a silicon nitride layer, a silicon oxynitride layer, a silicon oxide layer, a titanium oxide layer and an aluminum oxide layer are alternately stacked on one another. The organic layer may be an acryl resin, an epoxy resin, a phenolic resin, a polyamide resin or a polyimide resin.

The sensor electrode layer SENL is disposed on the encapsulation layer TFEL. The sensor electrode layer SENL may include the driving electrodes TE, the sensing electrodes RE and the touch connection electrodes BE.

A first touch inorganic layer TINS1 may be disposed on the encapsulation layer TFEL. The first touch inorganic layer TINS1 may be a silicon nitride layer, a silicon oxynitride layer, a silicon oxide layer, a titanium oxide layer, or an aluminum oxide layer.

The touch connection electrodes BE may be disposed on the first touch inorganic layer TINS1. The touch connection electrodes BE may be made up of a single layer of molybdenum (Mo), titanium (Ti), copper (Cu) or aluminum (Al), or may be made up of a stack structure of aluminum and titanium (Ti/Al/Ti), a stack structure of aluminum and ITO (ITO/Al/ITO), an APC alloy and a stack structure of an APC alloy and ITO (ITO/APC/ITO).

A second touch inorganic layer TINS2 may be disposed on the touch connection electrodes BE. The second touch inorganic layer TINS2 may be a silicon nitride layer, a silicon oxynitride layer, a silicon oxide layer, a titanium oxide layer, or an aluminum oxide layer.

The driving electrodes TE and the sensing electrodes RE may be disposed on the second touch inorganic layer TINS2. In order to prevent the light emitted from the emission areas EA1, EA2, EA3 and EA4 from being blocked by the driving electrodes TE and the sensing electrodes RE to thereby decrease the luminance of the light, the driving electrodes TE and the sensor electrodes RE do not overlap the emission areas EA1, EA2, EA3 and EA4 (i.e., in a plan view). The driving electrodes TE and the sensing electrodes RE may be made up of a single layer of molybdenum (Mo), titanium (Ti), copper (Cu) or aluminum (Al), or may be made up of a stack structure of aluminum and titanium (Ti/Al/Ti), a stack structure of aluminum and ITO (ITO/Al/ITO), an APC alloy, or a stack structure of an APC alloy and ITO (ITO/APC/ITO).

A touch organic layer TINS3 may be disposed on the driving electrodes TE and the sensing electrodes RE. The touch organic layer TINS3 may be an acryl resin, an epoxy resin, a phenolic resin, a polyamide resin and a polyimide resin.

FIG. 8 is a layout diagram showing an example of the second display area of FIG. 5. FIG. 8 is an enlarged view of area B of FIG. 5.

Referring to FIG. 8, the second display area DA2 of the first corner portion CS1 may include cut patterns CP, cut grooves CG, cutting connection patterns CBP and cutting gaps CCG.

Figure 12:
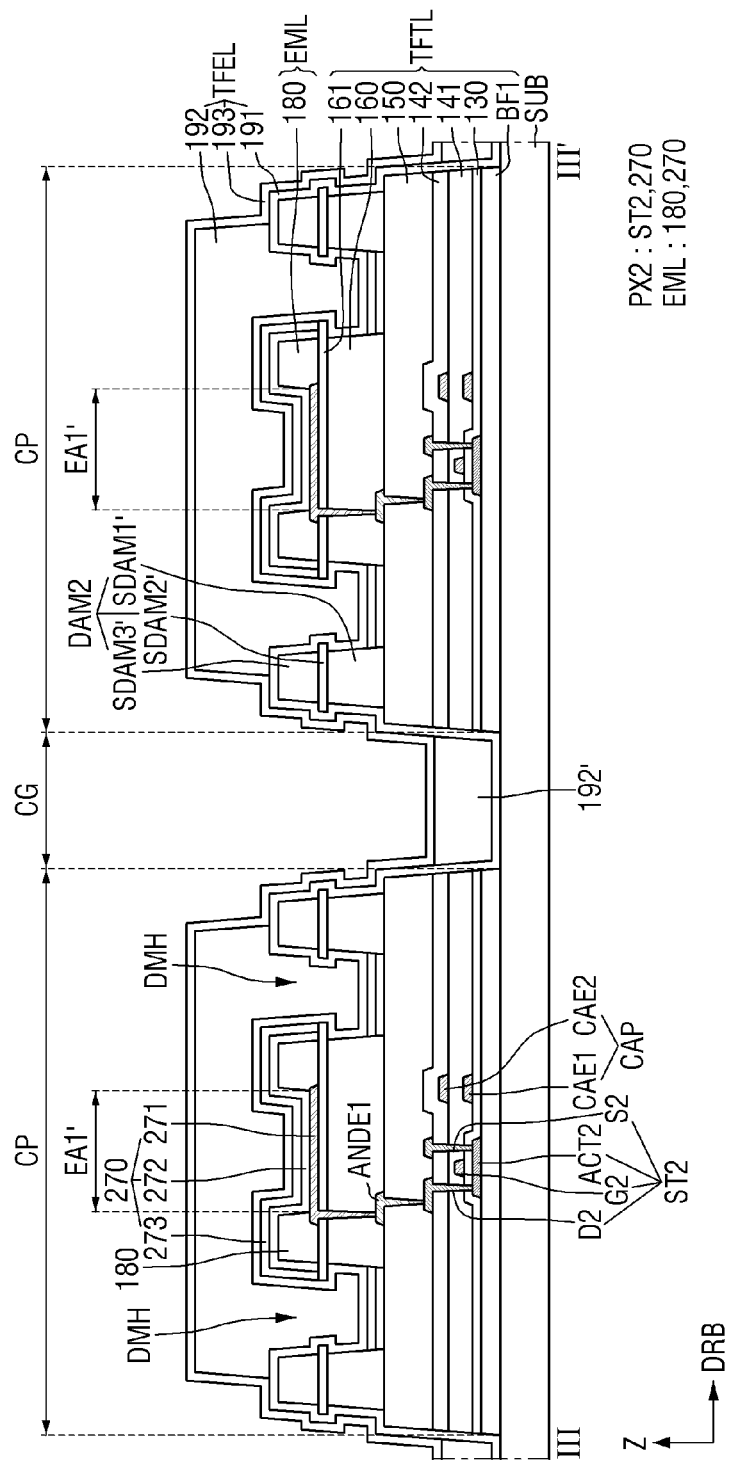
FIG. 12 is a cross-sectional view showing an example of the display panel taken along line III-III' of FIG. 8.

The cut patterns CP may be defined by the cut grooves CG. The cut grooves CG may be formed between the cut patterns CP adjacent to each other. The cut grooves CG may be formed by removing parts of the display panel 300 with a laser. The cut groove CG may be an empty space as shown in FIG. 12. For example, the cut grooves CG may be defined by removing at least a part of the thin-film transistor layer TFTL in the display panel 300 with a laser. The substrate SUB (see FIG. 12) may not be removed at the cut grooves CG. In the cut patterns CP, none of the elements (e.g., part of the thin-film transistor layer TFTL) may be removed with a laser.

The cutting gaps CCG may be formed by cutting the display panel 300 with a laser. The cutting gaps CCG may be formed between the cutting connection patterns CBP adjacent to each other. The cutting gaps CCG may be formed by cutting the display panel 300 with a laser. The cutting gap CCG may be an empty space. Therefore, the display panel 300 does not exist in the cutting gap CCG.

Each of the cut patterns CP may be disposed between the third display area DA3 and the cutting connection pattern CBP. One end of each of the cut patterns CP may be connected to the third display area DA3, and the other end thereof may be connected to the cutting connection pattern CBP.

The cutout connection patterns CBP may be disposed between the respective cut patterns CP and the non-display area NDA. One end of each of the cutout connection patterns CBP may be connected to the respective cut patterns CP and the other end thereof may be connected to the non-display area NDA.

The cutout connection patterns CBP may have a serpentine shape including a plurality of bent portions. The cutting connection patterns CBP may be designed to allow the cut patterns CP of the second display area DA2 to easily expand and contract. Therefore, it is possible to reduce the strain applied to the second display area DA2.

The second pixels PX2, the second dams DAM2, and a power contact hole PCT may be disposed in each of the cut patterns CP.

The second pixels PX2 may be arranged in an A-direction DRA. Each of the second pixels PX2 may include a plurality of emission areas EA1', EA2', and EA3'. The number of the emission areas EA1', EA2' and EA3' of each of the second pixels PX2 may be different from the number of the emission areas EA1, EA2, EA3 and EA4 of each of the first pixels PX1. However, the number of the emission areas EA1', EA2' and EA3' of each of the second pixels PX2 may be equal to, but is not limited to being, the number of the emission areas EA1, EA2, EA3 and EA4 of each of the first pixels PX1. The number of the emission areas EA1', EA2' and EA3' of each of the second pixels PX2 may be different from the number of the emission areas EA1", EA2" and EA3" each of the third pixels PX3.

For example, each of the third pixels PX3 may include a first emission area EA1', a second emission area EA2', and a third emission area EA3'. The first emission area EA1' refers to the emission area of the first sub-pixel emitting first light, the second emission area EA2' refers to the emission area of the second sub-pixel emitting second light, and the third emission area EA3' refers to the emission area of the third sub-pixel that emits third light.

The first emission area EA1', the second emission area EA2' and the third emission area EA3' may emit lights of different colors. For example, the first emission area EA1' may emit light of red color, the second emission area EA2' may emit light of green color, and the third emission area EA3' may emit light of blue color.

The first emission area EA1', the second emission area EA2' and the third emission area EA3' may be arranged in the A-direction DRA. Each of the first emission area EA1', the second emission area EA2' and the third emission area EA3' may have a rectangular shape when viewed from the top. For example, each of the first emission area EA1', the second emission area EA2' and the third emission area EA3' may have a rectangular shape having shorter sides (i.e., latitudinal sides) in the A-direction DRA and longer sides (i.e., longitudinal sides) in a B-direction DRB when viewed from the top (i.e., in a plan view). It is, however, to be understood that the present disclosure according to the invention is not limited thereto. In another embodiment, each of the first emission areas EA1', the second emission areas EA2' and the third emission areas EA3' may have other polygonal shape than a quadrangular shape, a circular shape or an elliptical shape when viewed from the top (i.e., in a plan view). Although the first emission area EA1', the second emission area EA2' and the third emission area EA3' have substantially the same area in the example shown in FIG. 11, the present disclosure according to the invention is not limited thereto. In another embodiment, at least one of the first emission area EA1', the second emission area EA2' and the third emission area EA3' may have a different area from the others of the first emission area EA1', the second emission area EA2' and the third emission area EA3'.

The second dam DAM2 may be disposed to surround the second pixels PX2. The second dam DAM2 may be disposed at the edges of each of the cut patterns CP.

The power contact hole PCT may be disposed in the area surrounded by the second dam DAM2. Although the power contact hole PCT is defined between the second dam DAM2 and the second pixel PX2 disposed at one edge of the cut pattern CP in the example shown in FIG. 8, the present disclosure according to the invention is not limited thereto. In another embodiment, the power contact hole PCT may be a power connector through which a first supply voltage line VSL (see FIG. 7) and a second common electrode 273 (see FIG. 12) are connected. Accordingly, the first supply voltage of the first supply voltage line VSL (see FIG. 7) may be applied to the second common electrode 273 (see FIG. 12).

As shown in FIG. 8, when the second display area DA2 includes the cut patterns CP, the cutout connection patterns CBP, and the cut grooves CG, the cut patterns CP can expand and contract. Therefore, the strain applied to the second display area DA2 can be reduced.

FIG. 9 is a layout diagram showing yet another example of the second display area of FIG. 5.

The second display area shown in FIG. 9 is different from the second display area of FIG. 8 in that the cutting connection patterns CBP and the cutting gaps CCG are eliminated and thus the cut patterns CP are connected directly to the non-display area NDA, and that the area of each of the cut patterns CP increases so that more second pixels PX2 can be disposed in the cut patterns CP. The redundant descriptions will be omitted.

FIGS. 10 and 11 are layout diagrams showing yet another example of the second display area of FIG. 5.

Referring to FIGS. 10 and 11, the second display area DA2 includes cut patterns CP' and cutouts CUP. The cut patterns CP' include island patterns ISP and connection patterns CNP. The cutouts CUP may be formed by removing parts of the display panel 300 with a laser. For example, the cutouts CUP may be formed by removing at least a part of the thin-film transistor layer TFTL in the display panel 300 with a laser. The substrate SUB (see FIG. 12) may not be removed at the cutouts CUP. In the cut patterns CP', none of the elements may be removed with a laser.

The island patterns ISP may include first to fourth island patterns ISP1, ISP2, ISP3, and ISP4. The connection patterns CNP may include first to fourth connection patterns CNP1, CNP2, CNP3, and CNP4. The cutouts CUP may include first to third cutouts CUP1, CUP2, and CUP3.

The first to fourth island patterns ISP1, ISP2, ISP3 and ISP4 may be spaced apart from one another. For example, since the first cutout CUP1 is located between the first island pattern ISP1 and the second island pattern ISP2, the first island pattern ISP1 may be spaced apart from the second island pattern ISP2 in a C-direction DRC. For example, since the second cutout CUP2 is located between the first island pattern ISP1 and the third island pattern ISP3, the third island pattern ISP3 may be spaced apart from the first island pattern ISP1 in a D-direction DRD. Since the second cutout CUP2 is located between the second island pattern ISP2 and the fourth island pattern ISP4, the fourth island pattern ISP4 may be spaced apart from the second island pattern ISP2 in the D-direction DRD. Since the third cutout CUP3 is located between the third island pattern ISP3 and the fourth island pattern ISP4, the fourth island pattern ISP4 may be spaced apart from the third island pattern ISP3 in the C-direction DRC.

The first to fourth connection patterns CNP1, CNP2, CNP3 and CNP4 may be extended from each of the first to fourth island patterns ISP1, ISP2, ISP3, and ISP4. Hereinafter, description will be made based on the first island pattern ISP1.

The first connection pattern CNP1 may be extended along the C-direction DRC from the first island pattern ISP1. The first connection pattern CNP1 may connect the first island pattern ISP1 with the second island pattern ISP2.

The second connection pattern CNP2 may be extended along the D-direction DRD from the first island pattern ISP1. The second connection pattern CNP2 may be connected to the island pattern disposed on the upper side of the first island pattern ISP1.

The third connection pattern CNP3 may be extended along the C-direction DRC from the first island pattern ISP1. The third connection pattern CNP3 may be connected to the island pattern disposed on the left side of the first island pattern ISP1.

The fourth connection pattern CNP4 may be extended along the D-direction DRD from the first island pattern ISP1. The fourth connection pattern CNP4 may be connected to the third island pattern ISP3.

The second pixel PX2' may be disposed in each of the first to fourth island patterns ISP1, ISP2, ISP3 and ISP4. The second pixel PX2' may include a first emission area EA1_1 that emits light of a first color, a second emission area EA2_1 that emits light of a second color, and a third emission area EA3_1 that emits light of a third color of light. For example, the first color may be red, the second color may be green, and the third color may be blue.

The first emission area EA1_1, the second emission area EA2_1 and the third emission area EA3_1 may be arranged in the C-direction DRC. The third emission area EA3_1 may be disposed between the first emission area EA1_1 and the second emission area EA2_1 in the C-direction DRC. Each of the first emission area EA1_1, the second emission area EA2_1 and the third emission area EA3_1 may have a rectangular shape when viewed from the top (i.e., in a plan view). For example, each of the first emission area EA1_1, the second emission area EA2_1 and the third emission area EA3_1 may have a rectangular shape having shorter sides (i.e., latitudinal sides) in the C-direction DRC and longer sides (i.e., longitudinal sides) in a D-direction DRD when viewed from the top. It is, however, to be understood that the present disclosure according to the invention is not limited thereto. In another embodiment, each of the first emission areas EA1_1, the second emission areas EA2_1 and the third emission areas EA3_1 may have other polygonal shape than a quadrangular shape, a circular shape or an elliptical shape when viewed from the top (i.e., in a plan view). In addition, although the area of the third emission areas EA3_1 is the larger than each of the area of the first emission area EA1_1 and the area of the second emission area EA2_1 in the example shown in FIGS. 10 and 11, the present disclosure according to the invention is not limited thereto.

Since at least a part of the thin-film transistor layer TFTL is removed with the laser in the cutouts CUP, the cutouts CUP can be stretched more easily than the cut patterns CP'. As a result, due to the double curvature of the first corner portion CS1, the distance between the first to fourth island patterns ISP1, ISP2, ISP3 and ISP4 may be widened, as shown in FIG. 11. That is to say, the first cutouts CUP1, the second cutouts CUP2 and the third cutouts CUP3 may be widened without changing the shapes of the island patterns ISP and the connection patterns CNP. Therefore, it is possible to reduce the strain applied to the second display area DA2.

FIG. 12 is a cross-sectional view showing an example of the display panel taken along line III-III' of FIG. 8. FIG. 12 is a cross-sectional view of the cut patterns CP and the cut grooves CG.

A second thin-film transistor ST2 of the thin-film transistor layer TFTL, the second pixel electrode 271 of the second light-emitting element 270, the second emissive layer 272 and the second common electrode 273 of FIG. 12 may be substantially identical to the first thin-film transistor ST1 of the thin-film transistor layer TFTL, the first pixel electrode 171 of the first light-emitting element 170, the first emissive layer 172 and the first common electrode 173 described above with reference to FIG. 7; and, therefore, the redundant description will be omitted. Only the first emission area EA1' is shown in the example of FIG. 12, the second emission area EA2' and the third emission area EA3' may be substantially identical to the first emission area EA1' of FIG. 12; and, therefore, the redundant description will be omitted.

The second display area DA2 includes cut patterns CP and cut grooves CG formed by removing parts of the display panel 300 with a laser.

At least a part of the thin-film transistor layer TFTL may be removed with a laser in each of the cut grooves CG. For example, in each of the cut grooves CG, none of the buffer layer BF1, the gate insulator 130, the first interlayer-dielectric layer 141, the second interlayer-dielectric layer 142, the first planarization layer 150 and the second planarization layer 160 may be disposed. In addition, the barrier layer 161 or the bank 180 may not be disposed in each of the cut grooves CG.

The substrate SUB, a first inorganic encapsulation layer 191, an organic pattern 192' and a second inorganic encapsulation layer 193 may be disposed in each of the cut grooves CG. In each of the cut grooves CG, the first inorganic encapsulation layer 191 may be disposed on the substrate SUB, the organic pattern 192' may be disposed on the first inorganic encapsulation layer 191, and the second inorganic encapsulation layer 193 may be disposed on the organic pattern 192'. In each of the cut grooves CG, the first inorganic encapsulation layer 191 may be in contact with the substrate SUB. In each of the cut grooves CG, the first inorganic encapsulation layer 191 may be disposed between the substrate SUB and the organic pattern 192'.

Incidentally, since the accuracy of the laser process is low, a part of the substrate SUB may be removed when the buffer layer BF1, the gate insulator 130, the first interlayer-dielectric layer 141, the second interlayer-dielectric layer 142 and the first the planarization layer 150 of the thin-film transistor TFTL are removed with a laser. Therefore, the height of the substrate SUB in the cut grooves CG may be different from the height of the substrate SUB in the cut patterns CP. Alternatively, the height of the substrate SUB in one of the cut grooves CG may be different from the height of the substrate SUB in another cut groove CG.

Since at least a part of the thin-film transistor layer TFTL is removed with the laser in each of the cut grooves CG, the cut grooves CG can be stretched more easily than the cut patterns CP. As a result, the cut grooves CG of the second display area DA2 are stretched due to the double curvature of the first corner portion CS1, and thus the distance between the cut grooves can be extended. Therefore, it is possible to reduce the strain applied to the second display area DA2.

The substrate SUB, the thin-film transistor layer TFTL, the emission material layer EML and the encapsulation layer TFEL may be disposed in each of the cut patterns CP. The organic encapsulation layer 192 of the encapsulation layer TFEL is formed via an inkjet process of dropping an organic material. In the process, the accuracy of the inkjet process is not high. Therefore, if the length of the cut pattern CP of the second display area DA2 in the B-direction DRB is several tens of μm, it is difficult to accurately position the organic material in the second dam DAM2 of the cut pattern CP. Since the organic encapsulation layer 192 is higher than the first inorganic encapsulation layer 191 and the second inorganic encapsulation layer 193, it works as a particle cover layer to cover particles. Therefore, if the organic encapsulation layer 192 is not disposed in the second dam DAM2 of the cut pattern CP, a hole may be defined in the first inorganic encapsulation layer 191 and the second inorganic encapsulation layer 193 by particles. As a result, moisture or oxygen may be introduced and thus the emissive layer 272 may be damaged. When this happens, the second pixels PX2 disposed in the cut patterns CP may be displayed as dark spots.

In view of the above, in order to reliably dispose the organic encapsulation layer 192 in the second dam DAM2 of the cut pattern CP, the organic material may be dropped onto the entire surface of the second display area DA2 during the inkjet process, instead of dropping it onto particular positions in the second dam DAM2 of the cut pattern CP. Accordingly, in the second display area DA2, the organic encapsulation layer 192 may be disposed in the second dam DAM2 of the cut pattern CP, and the organic pattern 192' made of the same material as the organic encapsulation layer 192 may be disposed on each of the cut grooves CG. In this case, the organic pattern 192' may be disposed between the first inorganic encapsulation layer 191 and the second inorganic encapsulation layer 193 in each of the cut grooves CG.

The thickness of the organic encapsulation layer 192 may be substantially equal to the thickness of the organic pattern 192'. As the organic encapsulation layer 192 and the organic pattern 192' are thicker, it is possible to prevent the emissive layer 272 from being damaged even by larger particles, so that the reliability of the display device 10 can be improved. As the organic encapsulation layer 192 and the organic pattern 192' are thinner, the thin-film transistor layer TFTL removed by the laser may be thinner. As the thickness of the thin-film transistor layer TFTL removed by the laser decreases, the cut grooves CG may be less stretched. The thickness of the thin-film transistor layer TFTL removed by the laser may be greater than each of the thickness of the organic encapsulation layer 192 and the organic pattern 192'. The thickness of each of the organic encapsulation layer 192 and the organic pattern 192' may be approximately 3 micrometers (μm) to 20 μm.

The second dam DAM2 may include a first sub-dam SDAM1' made of the same material as the second planarization layer 160, a second sub-dam SDAM2' made of the same material as the barrier layer 161, and a third sub-dam SDAM3' made of the same material as the bank 180. The second dam DAM2 may further include a fourth sub-dam disposed on the third sub-dam SDAM3'.

A dam hole DMH may be defined on the inner side of the second dam DAM2. When the second emissive layer 272 is formed using the same mask as the second common electrode 273 in the second display area DA2, a feature for disconnecting the second emissive layer 272, such as the dam hole DMH is required.

The dam hole DMH may be defined into an undercut profile. The undercut profile refers to a hole in which the inlet is smaller than the bottom or a hole in which the inlet is smaller than the area between the inlet and the bottom. A hole in the undercut profile may resemble a pot or eaves of a roof. For example, the entrance of the dam hole DMH may be defined by the barrier layer 161. The lower surface of the barrier layer 161 of the second planarization layer 160 may not be covered by the second planarization layer 160. Accordingly, the size of the inlet of the dam hole DMH may be smaller than the size of the area between the inlet and the bottom of the dam hole DMH.

In the dam hole DMH, a first floating pattern FP1, a second floating pattern FP2 and a first inorganic encapsulation layer 191 are disposed. The dam hole DMH may be filled with the organic encapsulation layer 192. It is to be noted that the second emissive layer 272 and the second common electrode 273 have poor step coverage. Therefore, when the dam hole DMH is defined into the undercut profile, the second emissive layer 272 and the second common electrode 273 may not be disposed on the sidewalls of the dam hole DMH. Accordingly, the second emissive layer 272 and the second common electrode 273 may be disconnected at the dam hole DMH. The step coverage refers to the ability of subsequent layers to evenly cover levels ("steps") already present on the substrate without being disconnected.

The first floating pattern FP1 may be disposed on the second planarization layer 160 in the dam hole DMH. The first floating pattern FP1 may be a residual layer of the second emissive layer 272 that is not connected to the second emissive layer 272 but is disconnected from it. The first floating pattern FP1 may be made of the same material as the second emissive layer 272. When the size of the dam hole DMH is small, the first floating pattern FP1 may not exist.

In addition, the second floating pattern FP2 may be disposed on the first floating pattern FP1 in the dam hole DMH. The second floating pattern FP2 may be a residual layer of the second common electrode 273 that is not connected to the second common electrode 273 but is disconnected from it. The second floating pattern FP2 may be made of the same material as the second common electrode 273. When the size of the dam hole DMH is small, the second floating pattern FP2 may be disposed.

As shown in FIG. 12, when the organic encapsulation layer 192 is formed via an inkjet process in which the organic material is dropped, the drop placement accuracy of the inkjet process is not high. Accordingly, it is difficult to accurately position the organic material in the second dam DAM2. Therefore, during the inkjet process, the organic material may not be dropped onto particular positions in the second dam DAA2 of the cut pattern CP but may be dropped onto the entire surface of the second display area DA2. By doing so, the organic encapsulation layer 192 can be reliably disposed in the second dam DAM2 of the cut pattern CP, and the organic pattern 192' made of the same material as the organic encapsulation layer 192 may be disposed in each of the cut grooves CG. Therefore, it is possible to prevent that moisture or oxygen is introduced and thus the emissive layer 272 is damaged, which may occur when the organic encapsulation layer 192 is not disposed in the second dam DAM2 of the cut pattern CP and thus a hole is defined in the first inorganic encapsulation layer 191 and the second inorganic encapsulation layer 193.

Figure 13:
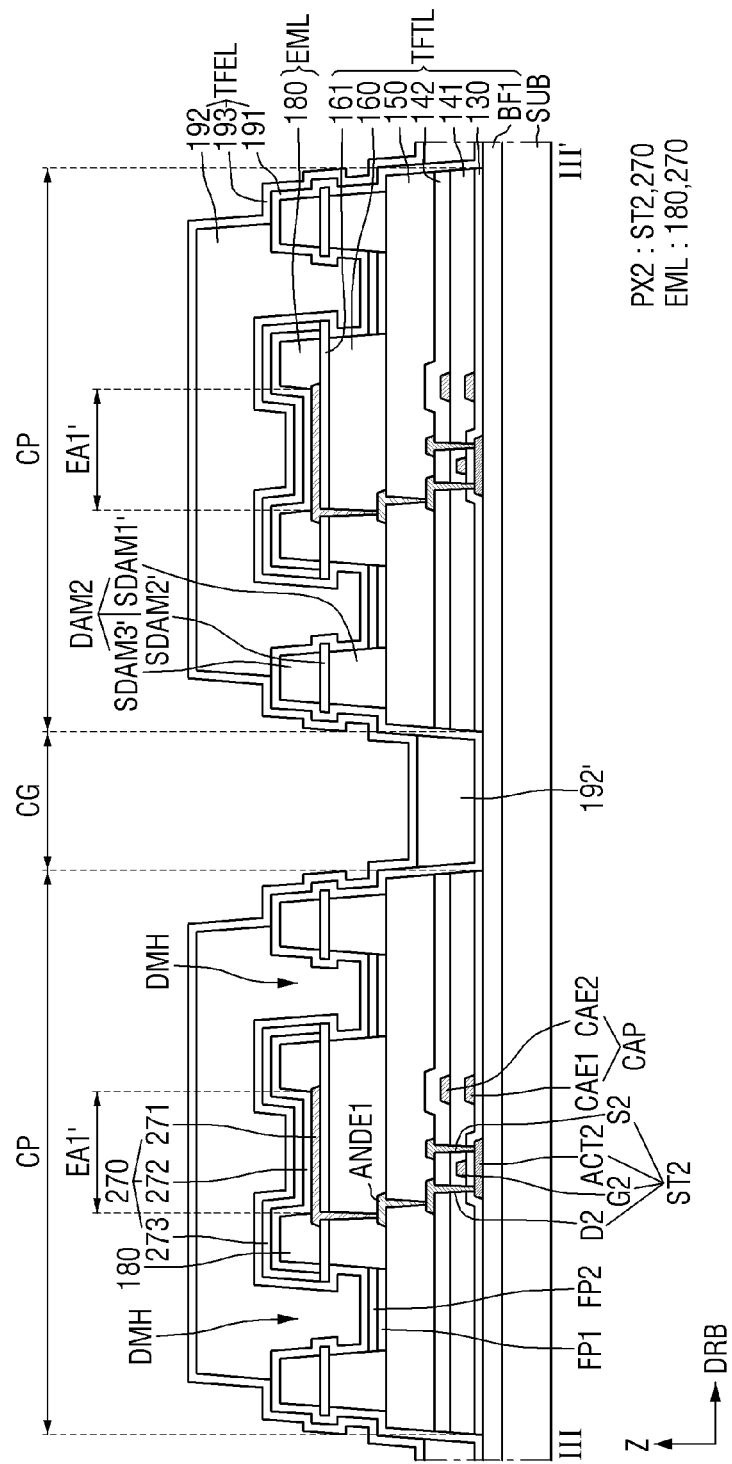
FIG. 13 is a cross-sectional view showing another example of the display panel taken along line III-III' of FIG. 8.

FIG. 13 is a cross-sectional view showing another example of the display panel taken along line III-III' of FIG. 8.

The embodiment of FIG. 13 is different from the embodiment of FIG. 12 in that a buffer layer BF1 is further disposed at the cut grooves CG. Description will focus on the difference.

Referring to FIG. 13, at least a part of the thin-film transistor layer TFTL may be removed with a laser in each of the cut grooves CG. For example, in each of the cut grooves CG, none of the gate insulator 130, the first interlayer-dielectric layer 141, the second interlayer-dielectric layer 142, the first planarization layer 150 and the second planarization layer 160 may be disposed. In addition, the barrier layer 161 or the bank 180 may not be disposed in each of the cut grooves CG.

The substrate SUB, the buffer layer BF1, the first inorganic encapsulation layer 191, the organic pattern 192' and the second inorganic encapsulation layer 193 may be disposed in each of the cut grooves CG. In each of the cut grooves CG, the first inorganic encapsulation layer 191 may be disposed on the buffer layer BF1, the organic pattern 192' may be disposed on the first inorganic encapsulation layer 191, and the second inorganic encapsulation layer 193 may be disposed on the organic pattern 192'. In each of the cut grooves CG, the first inorganic encapsulation layer 191 may be in contact with the buffer layer BF1. In each of the cut grooves CG, the first inorganic encapsulation layer 191 may be disposed between the buffer layer BF1 and the organic pattern 192'.

Incidentally, since the accuracy of the laser process is low, a part of the buffer layer BF1 may be removed when the gate insulator 130, the first interlayer-dielectric layer 141, the second interlayer-dielectric layer 142 and the first the planarization layer 150 of the thin-film transistor TFTL are removed with a laser. Therefore, the height of the buffer layer BF1 in the cut grooves CG may be different from the height of the buffer layer BF1 in the cut patterns CP. Alternatively, the height of the buffer layer BF1 in one of the cut grooves CG may be different from the height of the buffer BF1 in another cut groove CG.

Figure 14:
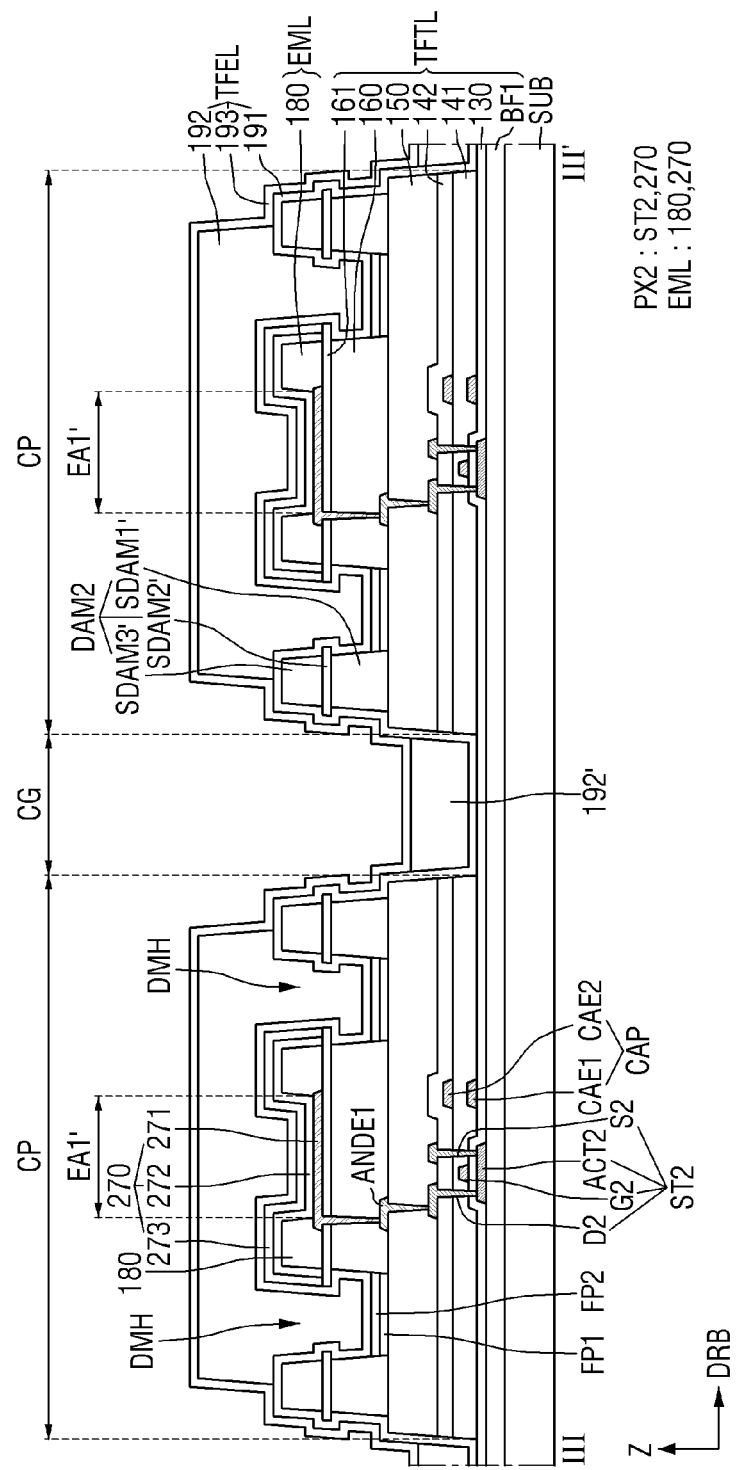
FIG. 14 is a cross-sectional view showing another example of the display panel taken along line III-III' of FIG. 8.

FIG. 14 is a cross-sectional view showing another example of the display panel taken along line III-III' of FIG. 8.

The embodiment of FIG. 14 is different from the embodiment of FIG. 12 in that a buffer layer BF1 and a gate insulator 130 are further disposed at the cut grooves CG. Description will focus on the differences.

Referring to FIG. 14, at least a part of the thin-film transistor layer TFTL may be removed with a laser in each of the cut grooves CG. For example, in each of the cut grooves CG, none of the first interlayer-dielectric layer 141, the second interlayer-dielectric layer 142, the first planarization layer 150 and the second planarization layer 160 may be disposed. In addition, the barrier layer 161 or the bank 180 may not be disposed in each of the cut grooves CG.

The substrate SUB, the buffer layer BF1, the gate insulator 130, the first inorganic encapsulation layer 191, the organic pattern 192' and the second inorganic encapsulation layer 193 may be disposed in each of the cut grooves CG. In each of the cut grooves CG, the first inorganic encapsulation layer 191 may be disposed on the gate insulator 130, the organic pattern 192' may be disposed on the first inorganic encapsulation layer 191, and the second inorganic encapsulation layer 193 may be disposed on the organic pattern 192'. In each of the cut grooves CG, the first inorganic encapsulation layer 191 may be in contact with the gate insulator 130. In each of the cut grooves CG, the first inorganic encapsulation layer 191 may be disposed between the gate insulator 130 and the organic pattern 192'.

Incidentally, since the accuracy of the laser process is low, a part of the gate insulator 130 may be removed when the first interlayer-dielectric layer 141, the second interlayer-dielectric layer 142 and the first the planarization layer 150 of the thin-film transistor TFTL are removed with a laser. Therefore, the height of the gate insulator 130 in the cut grooves CG may be different from the height of the gate insulator 130 in the cut patterns CP. Alternatively, the height of the gate insulator 130 in one of the cut grooves CG may be different from the height of the gate insulator 130 in another cut groove CG.

Figure 15:
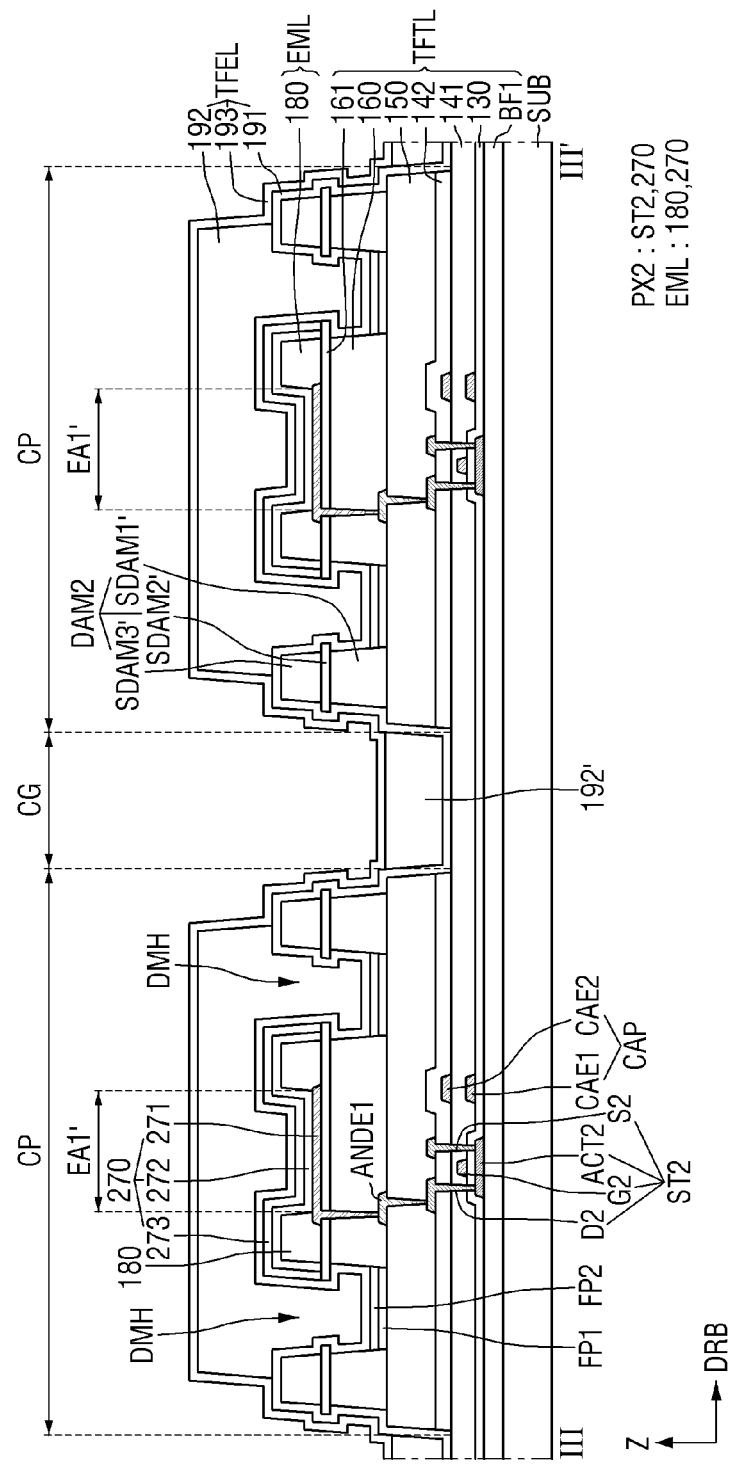
FIG. 15 is a cross-sectional view showing another example of the display panel taken along line III-III' of FIG. 8.

FIG. 15 is a cross-sectional view showing another example of the display panel taken along line III-III' of FIG. 8.

The embodiment of FIG. 15 is different from the embodiment of FIG. 12 in that a buffer layer BF1, a gate insulator 130 and a first interlayer-dielectric layer 141 are further disposed at the cut grooves CG. Description will focus on the difference.

Referring to FIG. 15, at least a part of the thin-film transistor layer TFTL may be removed with a laser in each of the cut grooves CG. For example, in each of the cut grooves CG, none of the second interlayer-dielectric layer 142, the first planarization layer 150 and the second planarization layer 160 may be disposed. In addition, the barrier layer 161 or the bank 180 may not be disposed in each of the cut grooves CG.

The substrate SUB, the buffer layer BF1, the gate insulator 130, the first interlayer-dielectric layer 141, the first inorganic encapsulation layer 191, the organic pattern 192' and the second inorganic encapsulation layer 193 may be disposed in each of the cut grooves CG. In each of the cut grooves CG, the first inorganic encapsulation layer 191 may be disposed on the first interlayer-dielectric layer 141, the organic pattern 192' may be disposed on the first inorganic encapsulation layer 191, and the second inorganic encapsulation layer 193 may be disposed on the organic pattern 192'. In each of the cut grooves CG, the first inorganic encapsulation layer 191 may be in contact with the first interlayer-dielectric layer 141. In each of the cut grooves CG, the first inorganic encapsulation layer 191 may be disposed between the first interlayer-dielectric layer 141 and the organic pattern 192'.

Incidentally, since the accuracy of the laser process is low, a part of the first interlayer-dielectric layer 141 may be removed when the second interlayer-dielectric layer 142 and the first the planarization layer 150 of the thin-film transistor TFTL are removed with a laser. Therefore, the height of the first interlayer-dielectric layer 141 in the cut grooves CG may be different from the height of the first interlayer-dielectric layer 141 in the cut patterns CP. Alternatively, the height of the first interlayer-dielectric layer 141 in one of the cut grooves CG may be different from the height of the first interlayer-dielectric layer 141 in another cut groove CG.

Figure 16:
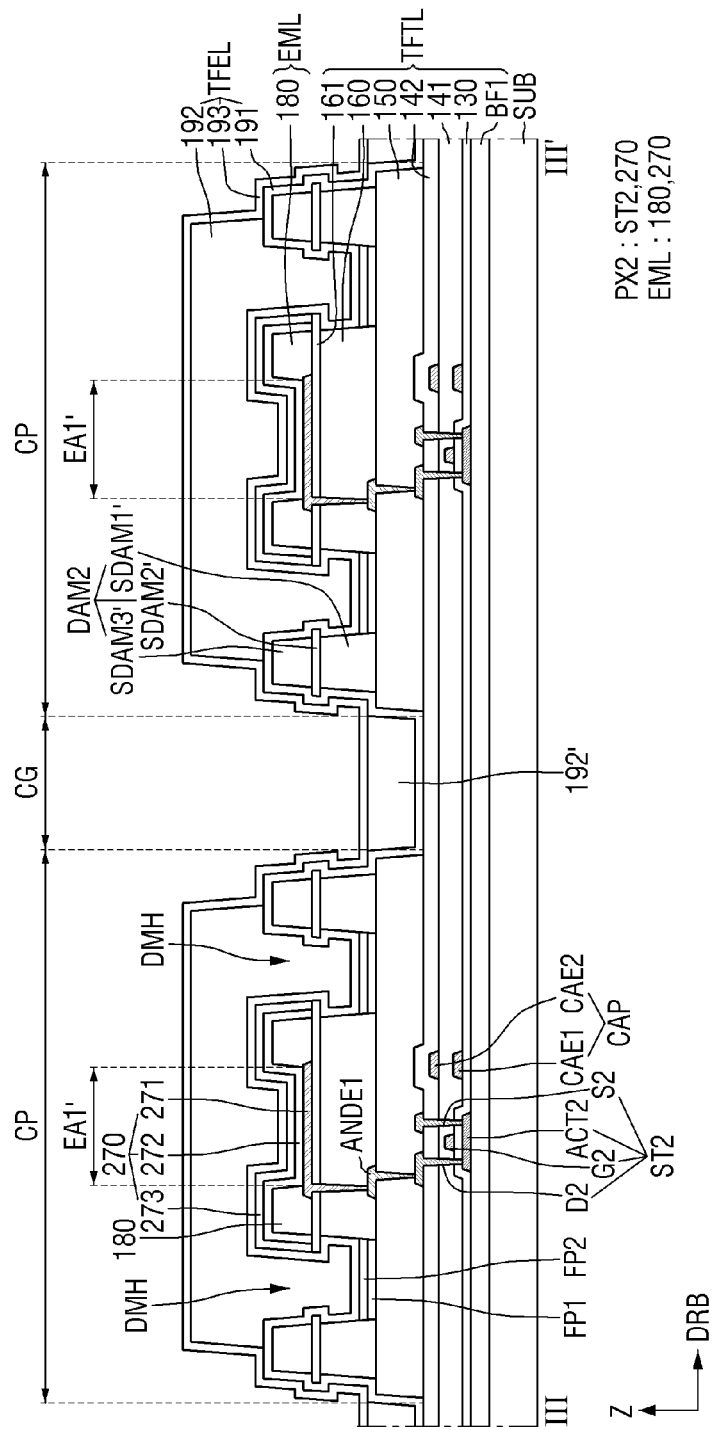
FIG. 16 is a cross-sectional view showing another example of the display panel taken along line III-III' of FIG. 8.

FIG. 16 is a cross-sectional view showing another example of the display panel taken along line III-III' of FIG. 8.

The embodiment of FIG. 16 is different from the embodiment of FIG. 12 in that a buffer layer BF1, a gate insulator 130, a first interlayer-dielectric layer 141 and a second interlayer-dielectric layer 142 are further disposed at the cut grooves CG. Description will focus on the difference.

Referring to FIG. 16, at least a part of the thin-film transistor layer TFTL may be removed with a laser in each of the cut grooves CG. For example, in each of the cut grooves CG, none of the first planarization layer 150 and the second planarization layer 160 may be disposed. In addition, the barrier layer 161 or the bank 180 may not be disposed in each of the cut grooves CG.

The substrate SUB, the buffer layer BF1, the gate insulator 130, the first interlayer-dielectric layer 141, the second interlayer-dielectric layer 142, the first inorganic encapsulation layer 191, the organic pattern 192' and the second inorganic encapsulation layer 193 may be disposed in each of the cut grooves CG. In each of the cut grooves CG, the first inorganic encapsulation layer 191 may be disposed on the second interlayer-dielectric layer 142, the organic pattern 192' may be disposed on the first inorganic encapsulation layer 191, and the second inorganic encapsulation layer 193 may be disposed on the organic pattern 192'. In each of the cut grooves CG, the first inorganic encapsulation layer 191 may be in contact with the second interlayer-dielectric layer 142. In each of the cut grooves CG, the first inorganic encapsulation layer 191 may be disposed between the second interlayer-dielectric layer 142 and the organic pattern 192'.

Incidentally, since the accuracy of the laser process is low, a part of the second interlayer-dielectric layer 142 may be removed or the first planarization layer 150 may remain when the first the planarization layer 150 of the thin-film transistor TFTL is removed with a laser. Therefore, the height of the second interlayer-dielectric layer 142 in the cut grooves CG may be different from the height of the second interlayer-dielectric layer 142 in the cut patterns CP. Alternatively, the height of the second interlayer-dielectric layer 142 in one of the cut grooves CG may be different from the height of the second interlayer-dielectric layer 142 in another cut groove CG.

Figure 17:
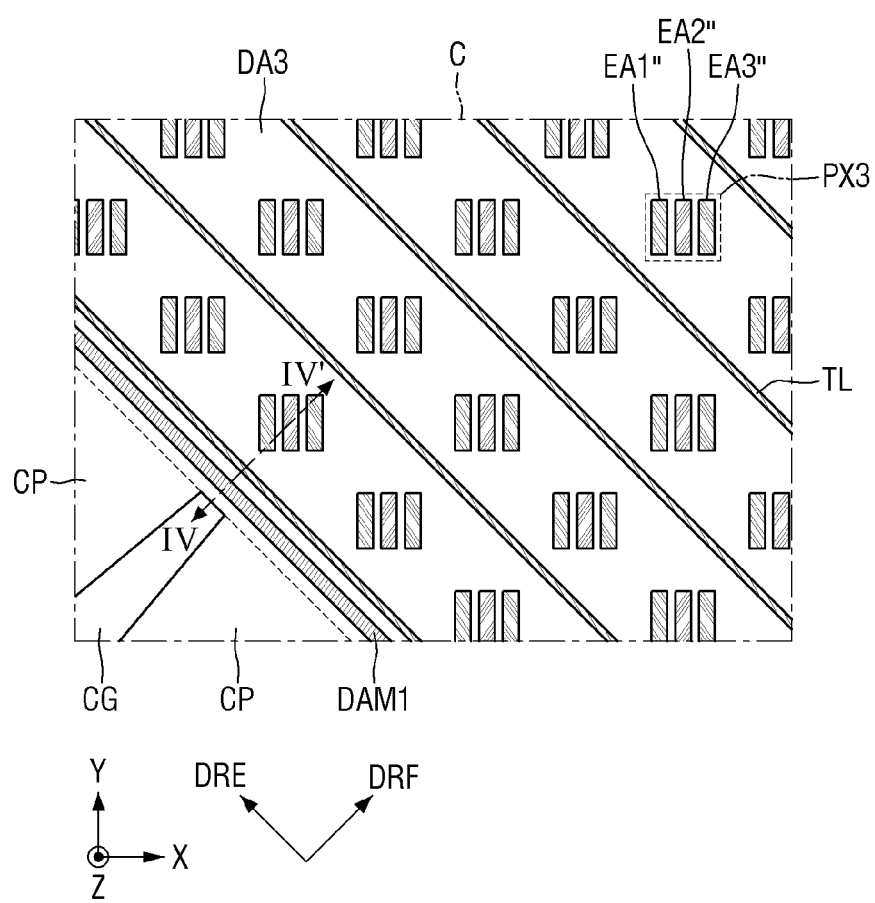
FIG. 17 is a layout diagram showing an example of the third display area of FIG. 5.

FIG. 17 is a layout diagram showing an example of the third display area of FIG. 5. FIG. 17 is an enlarged view of area C of FIG. 5.

Referring to FIG. 17, touch driving lines TL may be extended in an E-direction DRE. The E-direction DRE may be inclined by 135 degrees from the first direction (x-axis direction) and by 45 degrees from the second direction (y-axis direction). The touch driving lines TL may be arranged in an F-direction DRF crossing the E-direction DRE. The F-direction DRF may be inclined by 45 degrees from the first direction (x-axis direction) and by 45 degrees from the second direction (y-axis direction).

Third pixels PX3 may be disposed between the touch driving lines TL adjacent to each other. The third pixels PX3 disposed between the touch driving lines TL adjacent to each other may be arranged in the E-direction DRE. At least one touch driving line TL may be disposed between the second emission areas EA1' adjacent to each other in the F-direction DRF. The spacing distance between the touch driving lines TL in the F-direction DRF and the spacing distance between the third pixels PX3 in the F-direction DRF may be approximately several tens of μm.

Each of the third pixels PX3 may include a plurality of emission areas EA1", EA2", and EA3". The number of the emission areas EA1", EA2" and EA3" of each of the third pixels PX3 may be different from the number of the emission areas EA1, EA2, EA3 and EA4 of each of the first pixels PX1.

For example, each of the third pixels PX3 may include a first emission area EA1", a second emission area EA2", and a third emission area EA3". The first emission area EA1" refers to the emission area of the first sub-pixel emitting first light, the second emission area EA2" refers to the emission area of the second sub-pixel emitting second light, and the third emission area EA3" refers to the emission area of the third sub-pixel that emits third light.

The first emission area EA1", the second emission area EA2" and the third emission area EA3" may emit lights of different colors. For example, the first emission area EA1" may emit light of red color, the second emission area EA2" may emit light of green color, and the third emission area EA3" may emit light of blue color.

The first emission area EA1", the second emission area EA2" and the third emission area EA3" may be arranged in the first direction (x-axis direction). Alternatively, the first emission area EA1", the second emission area EA2" and the third emission area EA3" may be arranged in the F-direction DRF.

The shape of each of the emission areas EA1", EA2" and EA3" of the third pixels PX3 may be different from the shape of each of the emission areas EA1, EA2, EA3 and EA4 of the first pixels PX1 when viewed from the top. For example, each of the first emission area EA1", the second emission area EA2" and the third emission area EA3" may have a rectangular shape when viewed from the top (i.e., in a plan view). Each of the first emission area EA1", the second emission area EA2" and the third emission area EA3" may have a rectangular shape having shorter sides (i.e., latitudinal sides) in the first direction (x-axis direction) and longer sides (i.e., longitudinal sides) in the second direction (y-axis direction) when viewed from the top (i.e., in a plan view).

It is, however, to be understood that the shape of each of the first emission areas EA1", the second emission areas EA2" and the third emission areas EA3" when viewed from the top according to the invention is not limited thereto. In another embodiment, each of the first emission areas EA1", the second emission areas EA2" and the third emission areas EA3" may have other polygonal shape than a quadrangular shape, a circular shape or an elliptical shape when viewed from the top (i.e., in a plan view). Although the first emission area EA1", the second emission area EA2" and the third emission area EA3" have substantially the same area in the example shown in FIG. 17, the present disclosure according to the invention is not limited thereto. In another embodiment, at least one of the first emission area EA1", the second emission area EA2" and the third emission area EA3" may have a different area from the others of the first emission area EA1", the second emission area EA2" and the third emission area EA3".

A first dam DAM1 may be disposed at an edge of the third display area DA3 adjacent to the second display area DA2. The first dam DAM1 may be disposed between the touch driving line TL and the cut pattern CP of the second display area DA2. The first dam DAM1 may be a feature for preventing overflow of the organic encapsulation layer 192 (see FIG. 18) of the encapsulation layer TFEL. The first dam DAM1 may be extended in the E-direction DRE.

As shown in FIG. 17, the third display area DA3 including third pixels PX3 displaying images is disposed between the first display area DA1 and the second display area DA2. Therefore, it is possible to prevent a user from recognizing a gap between the image displayed on the first display area DA1 and the image displayed on the second display area DA2.

Figure 18:
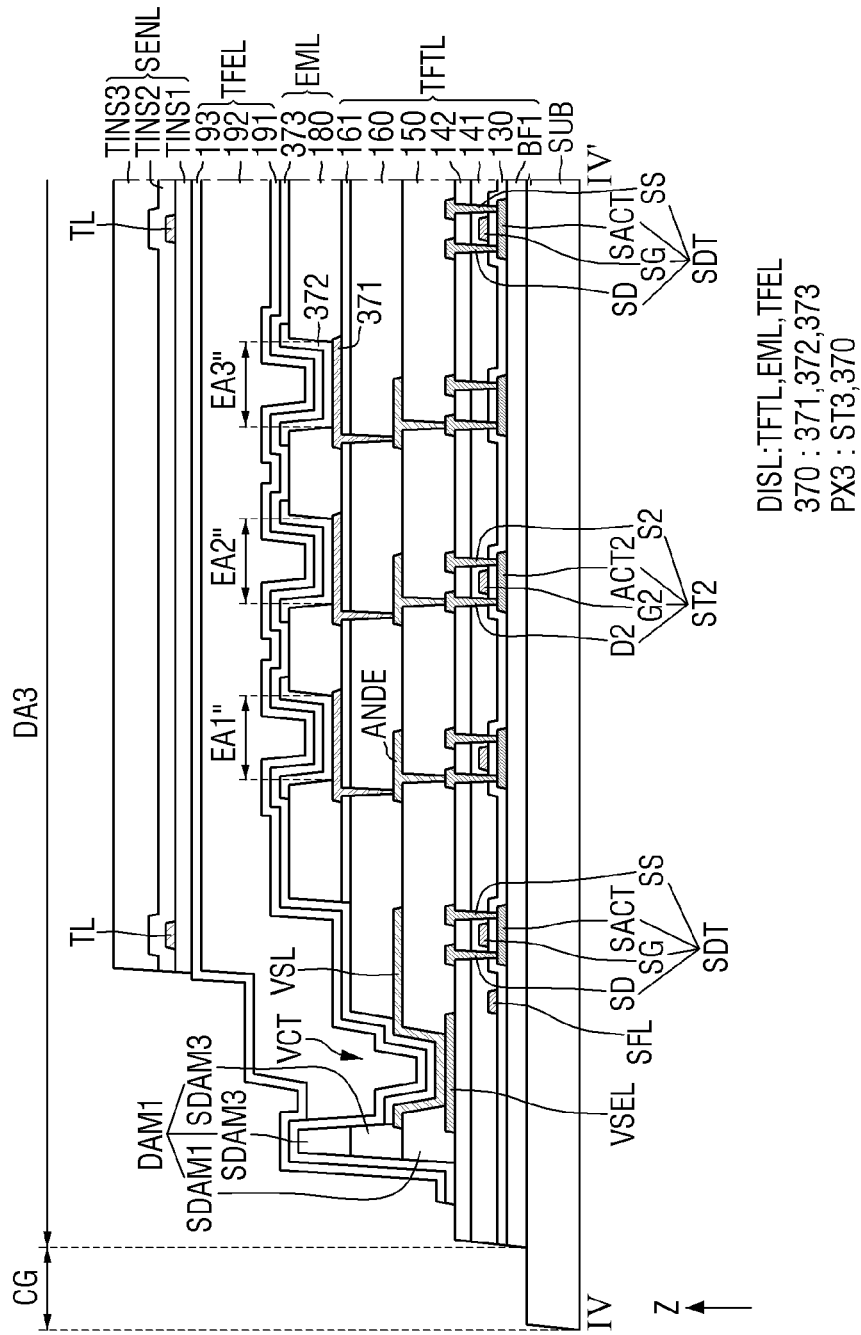
FIG. 18 is a cross-sectional view showing an example of the display panel, taken along line IV-IV' of FIG. 17.

FIG. 18 is a cross-sectional view showing an example of the display panel, taken along line IV-IV' of FIG. 17.

A second thin-film transistor ST2 of the thin-film transistor layer TFTL, a third pixel electrode 371 of the third light-emitting element 370, a third emissive layer 372 and a third common electrode 373 of FIG. 18 may be substantially identical to the first thin-film transistor ST1 of the thin-film transistor layer TFTL, the first pixel electrode 171 of the first light-emitting element 170, the first emissive layer 172 and the first common electrode 173 described above with reference to FIG. 7; and, therefore, the redundant description will be omitted.

The third display area DA3 may include third pixels PX3 and touch driving lines TL. The touch driving lines TL may be connected to the driving electrodes TE (see FIG. 6). The third display area DA3 may include not only the touch driving lines TL but also touch sensing lines connected to the sensing electrodes RE (see FIG. 6).

In order to prevent or reduce the luminance of the light from being reduced as the light emitted from the emission areas EA1", EA2" and EA3" of the third display area DA3 is blocked by the touch driving lines TL, the touch driving lines TL do not overlap with the first emission area EA1", the second emission area EA2" or the third emission area EA3" (i.e., in a plan view). The touch driving lines TL may be disposed on the first touch inorganic layer TINS1. The touch driving lines TL may be made of the same material on the same layer as the connection electrodes BE1 of FIG. 6.

A scan driving transistor SDT of a scan driver circuit SDC may include a scan active layer SACT, a scan gate electrode SG, a scan source electrode SS and a scan drain electrode SD. The scan active layer SACT, the scan gate electrode SG, the scan source electrode SS and the scan drain electrode SD of the scan driving transistor SDT may be substantially identical to the first active layer ACT1, the first gate electrode G1, the first source electrode S1 and the first drain electrode D1 of the first thin-film transistor ST1 described above with reference to FIG. 7; and, therefore, the redundant description will be omitted.

The scan driving transistor SDT is disposed in the thin-film transistor layer TFTL together with the second thin-film transistors ST2 for driving the first emission area EA1", the second emission area EA2" and the third emission area EA3" of the third pixels PX3. Therefore, the scan driving transistor SDT may be disposed in a position where the second thin-film transistors ST2 are not disposed in order to avoid the second thin-film transistors ST2. Since the touch driving lines TL are disposed not to overlap with the first emission area EA1", the second emission area EA2" and the third emission area EA3", the scan driving transistor SDT may overlap with the touch driving line TL in the direction (i.e., z-axis direction, in a plan view).

A first voltage connection line VSEL may be disposed on the second interlayer-dielectric layer 142. The first voltage connection line VSEL may be made of the same material as the first source electrode S1 and the first drain electrode D1 of the first thin-film transistor ST1, the second source electrode S2 and the second drain electrode D2 of the second thin-film transistor ST2, and the source electrode SS and the drain electrode SD of the scan driving transistor SDT.

A first supply voltage line VSL may be disposed on the first planarization layer 150. The first supply voltage line VSL may be formed of or include the same material as the pixel connection electrode ANDE1. The first supply voltage line VSL may be connected to the first voltage connection line VSEL through a contact hole penetrating the first planarization layer 150. A first supply voltage may be applied to the first supply voltage line VSL.

The third common electrode 373 may be connected to a first supply voltage line VSSL through a contact hole penetrating the second planarization layer 160. The first supply voltage of the first supply voltage line VSSL may be applied to the third common electrode 373.

The first dam DAM1 may be disposed in the third display area DA3 to prevent the organic encapsulation layer 192 of the thin-film encapsulation layer from overflowing. The first dam DAM1 may include a first sub-dam SDAM1 made of the same material as the first planarization layer 150, a second sub-dam SDAM2 made of the same material as the second planarization layer 160, and a third sub-dam SDAM3 made of the same material as the bank 180. Due to the first dam DAM1, the end of the organic encapsulation layer 192 may be disposed between the outermost first emission area EA1" and the dam DAM. The first inorganic encapsulation layer 191 and the second inorganic encapsulation layer 193 may be disposed on the first dam DAM1. The first inorganic encapsulation layer 191 and the second inorganic encapsulation layer 193 may be in contact with each other on the first dam DAM1.

Another dam for confining the organic encapsulation layer 192 which flows over the first dam DAM1 may be disposed on the outer side of the first dam DAM1. The another dam may have substantially the same structure as the first dam DAM1. Alternatively, the another dam may include at least one of the first sub-dam SDAM1, the second sub-dam SDAM2 and the third sub-dam SDAM3 of the first dam DAM1.

As shown in FIG. 18, the scan driving transistors SDTs of the scan driver circuit SDC may be disposed at positions where the second thin-film transistors ST2 are not disposed in order to avoid the second thin-film transistors ST2 for driving the first emission area EA1", the second emission area EA2" and the third emission area EA3" of the third pixel PX3. In such case, since the touch driving lines TL are disposed not to overlap with the first emission area EA1", the second emission area EA2" and the third emission area EA3", the scan driving transistor SDT may overlap with the touch driving line TL in the direction (i.e., z-axis direction, in a plan view).

Figure 19:
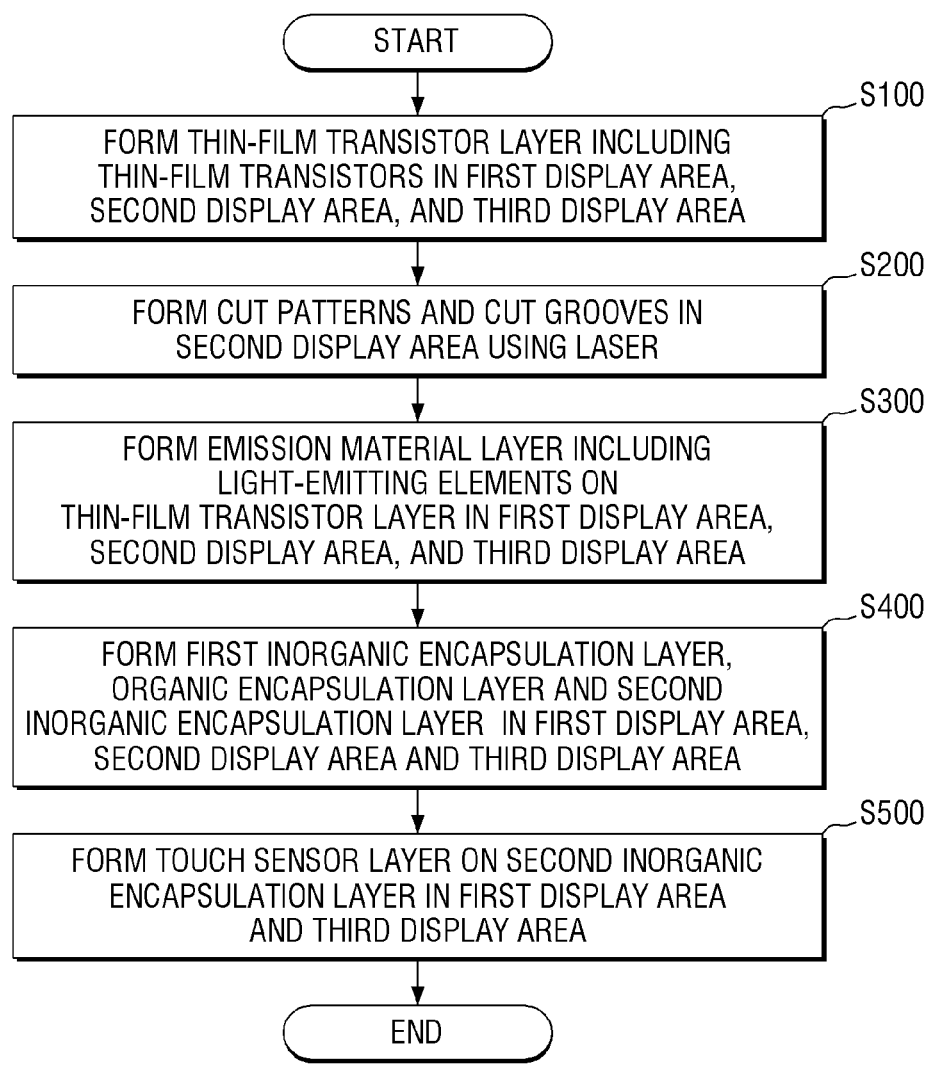
FIG. 19 is a flowchart for illustrating a method of fabricating a display device according to an embodiment of the present disclosure.

FIG. 19 is a flowchart for illustrating a method of fabricating a display device according to an embodiment of the present disclosure. FIGS. 20 to 31 are cross-sectional views for illustrating the method of fabricating a display device according to an embodiment of the present disclosure.

FIGS. 20, 24, 27 and 30 are cross-sectional views showing an example of a display panel, taken along line II-II' of FIG. 6. FIGS. 21, 23, 25 and 28 are cross-sectional views showing an example of a display panel, taken along line III-III' of FIG. 8. FIGS. 22, 26, 29 and 31 are cross-sectional views showing an example of a display panel, taken along line IV-IV' of FIG. 17. FIGS. 20, 24, 27 and 30 show the first display area DA1 of the display panel 300. FIGS. 21, 23, 25 and 28 show the second display area DA2 of the display panel 300. FIGS. 22, 26, 29 and 31 show the third display area DA3.

Figure 20:
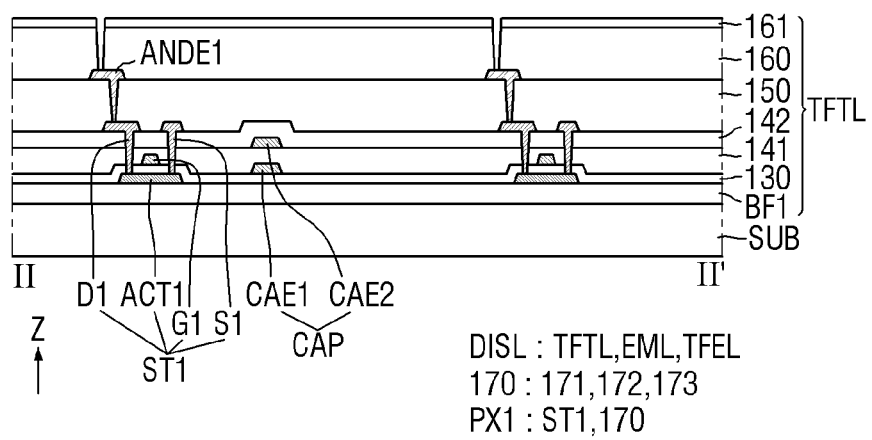
FIGS. 20 to 31 are cross-sectional views for illustrating the method of fabricating a display device according to an embodiment of the present disclosure.
Figure 21:
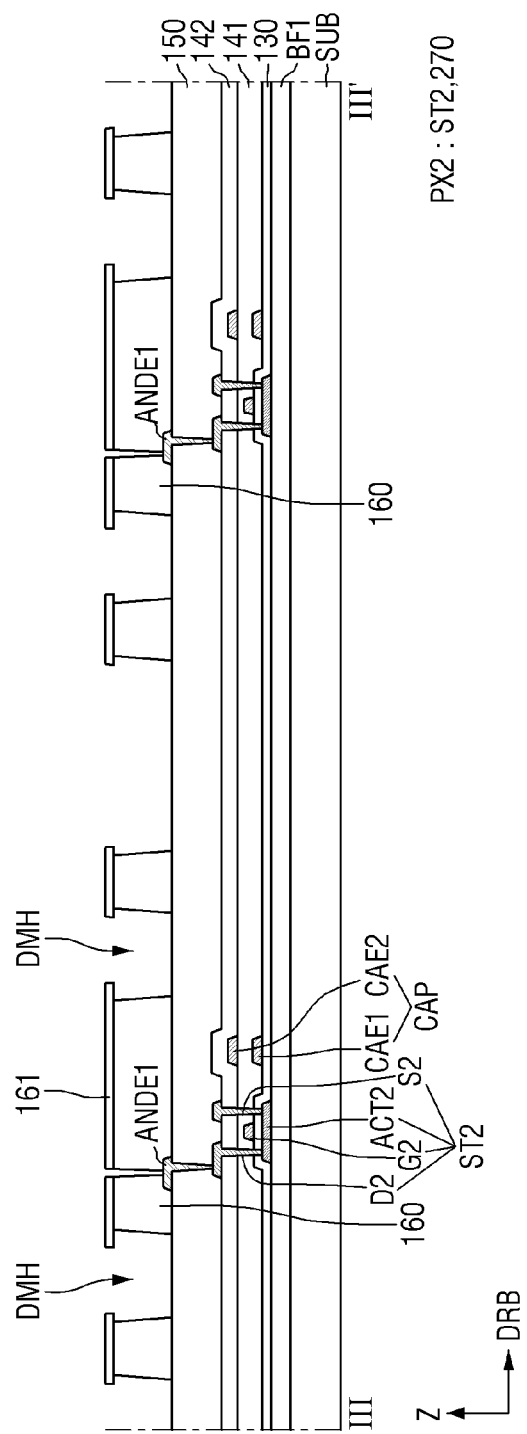
Figure 22:
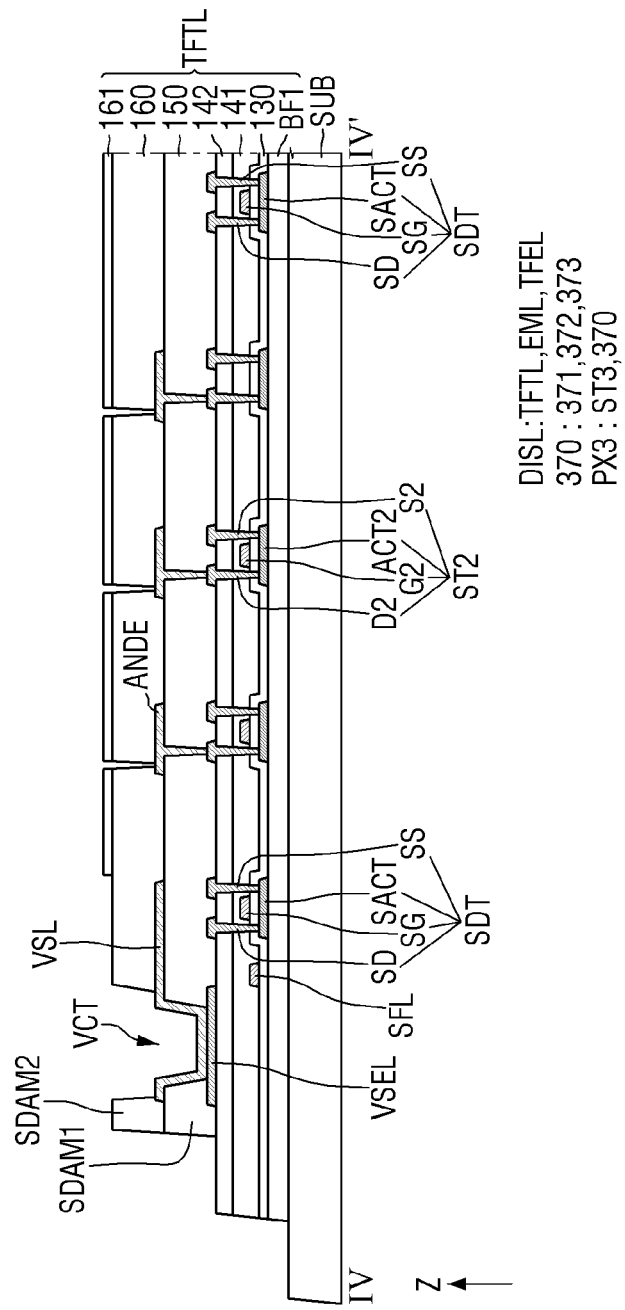

First, as shown in FIGS. 20 to 22, a thin-film transistor layer TFTL including thin-film transistors is disposed in the first display area DA1, the second display area DA2 and the third display area DA3 (step S100 of FIG. 19).

The thin-film transistor layer TFTL includes first thin-film transistors ST1, second thin-film transistors ST2, third thin-film transistors ST3, scan driving transistors SDT, and a plurality of insulating layers.

The first thin-film transistors ST1 are disposed in the first display area DA1 and each include a first active layer ACT1, a first source electrode S1, a first drain electrode D1 and a first gate electrode G1. The second thin-film transistors ST2 are disposed in the second display area DA2 and each include a second active layer ACT2, a second source electrode S2, a second drain electrode D2 and a second gate electrode G2. The third thin-film transistors ST3 are disposed in the third display area DA3 and each include a third active layer ACT3, a third source electrode S3, a third drain electrode D3 and a third gate electrode G3. The scan driving transistors SDT are disposed in the third display area DA3 and each include a scan active layer SACT, a scan source electrode SS, a scan drain electrode SD and a scan gate electrode SG. The plurality of insulating layers includes a buffer layer BF1, a gate insulator 130, a first interlayer-dielectric layer 141, a second interlayer-dielectric layer 142, a first planarization layer 150, and a second planarization layer 160.

The first active layer ACT1, the second active layer ACT2, the third active layer ACT3 and the scan active layer SACT are simultaneously formed on the buffer layer BF1 by using a photolithography process.

The gate insulator 130 is formed by depositing an inorganic material on the first active layer ACT1, the second active layer ACT2, the third active layer ACT3 and the scan active layer SACT.

The first gate electrode G1, the second gate electrode G2, the third gate electrode G3, the scan gate electrode SG and the first capacitor electrode CAE1 are formed simultaneously on the gate insulator 130 by using a photolithography process.

An inorganic material is deposited on the first gate electrode G1, the second gate electrode G2, the third gate electrode G3, the scan gate electrode SG and the first capacitor electrode CAE1 to form the first interlayer-dielectric layer 140.

A second capacitor electrode CAE2 is formed on the first interlayer-dielectric layer 141 using a photolithography process.

An inorganic material is deposited on the second capacitor electrode CAE2 to form the second interlayer-dielectric layer 142.

The source electrodes S1, S2, S3 and SS and the drain electrodes D1, D2, D3 and SD are simultaneously formed on the second interlayer-dielectric layer 142 using a photolithography process. Each of the first source electrode S1 and the first drain electrode D1 may be connected to the first active layer ACT1 through a contact hole penetrating the gate insulator 130, the first interlayer-dielectric layer 141 and the second interlayer-dielectric layer 142. Each of the second source electrode S2 and the second drain electrode D2 may be connected to the second active layer ACT2 through a contact hole penetrating the gate insulator 130, the first interlayer-dielectric layer 141 and the second interlayer-dielectric layer 142. Each of the third source electrode S3 and the third drain electrode D3 may be connected to the third active layer ACT3 through a contact hole penetrating the gate insulator 130, the first interlayer-dielectric layer 141 and the second interlayer-dielectric layer 142. Each of the scan source electrode SS and the scan drain electrode SD may be connected to the scan active layer SACT through a contact hole penetrating the gate insulator 130, the first interlayer-dielectric layer 141 and the second interlayer-dielectric layer 142.

The first planarization layer 150 is formed by depositing an organic material on the source electrodes S1, S2, S3 and SS and the drain electrodes D1, D2, D3, and SD.

The pixel connection electrode ANDE1 is formed on the first planarization layer 150. In the first display area DA1, the pixel connection electrode ANDE1 may be connected to the first drain electrode D1 through a contact hole penetrating the first planarization layer 150. In the second display area DA2, the pixel connection electrode ANDE1 may be connected to the second drain electrode D2 through a contact hole penetrating the first planarization layer 150. In the third display area DA3, the pixel connection electrode ANDE1 may be connected to the third drain electrode D3 through a contact hole penetrating the first planarization layer 150.

An organic material is deposited on the pixel connection electrode ANDE1 to form the second planarization layer 160.

A barrier layer 161 is formed by depositing an inorganic material on the second planarization layer 160. In the first display area DA1, the second display area DA2 and the third display area DA3, contact holes that penetrate the second planarization layer 160 and the barrier layer 161 to expose the pixel connection electrode ANDE1 may be formed.

In addition, dam holes DMH and voltage connection holes VCT may be defined by etching a part of the barrier layer 161 and then etching the second planarization layer 160 using the barrier layer 161 as a mask. In doing so, by adjusting the etching time of the second planarization layer 160, the dam holes DMH and the voltage connection holes VCT may be defined into an undercut profile that is exposed without being covered by the second planarization layer 160 on the lower surface of the barrier layer 161.

Figure 23:
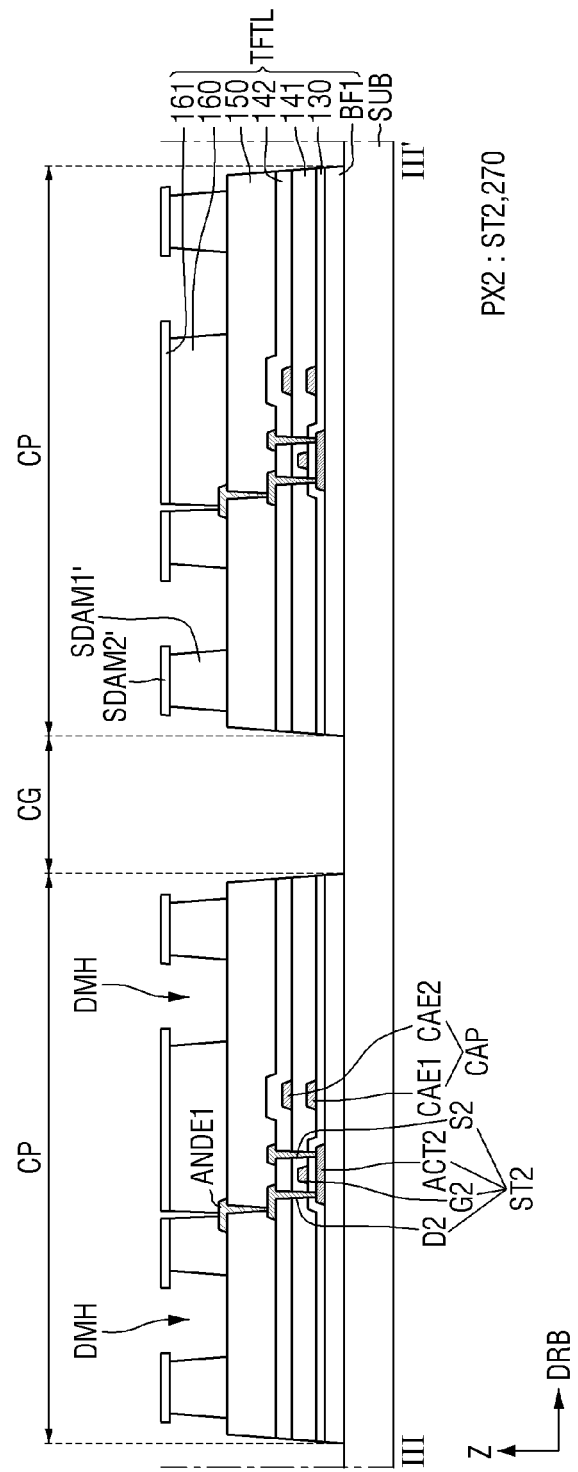

Second, as shown in FIG. 23, cut patterns CP and cut grooves CG are formed in the second display area DA2 using a laser (step S200 of FIG. 19).

At least a part of the thin-film transistor layer TFTL in the second display area DA2 may be removed with a laser. In the example shown in FIG. 23, the buffer layer BF1, the gate insulator 130, the first interlayer-dielectric layer 141, the second interlayer-dielectric layer 142 and the first planarization layer 150 of the thin-film transistor layer TFTL are removed by a laser in the second display area DA2. It is, however, to be understood that the present disclosure is according to the invention not limited thereto. In another embodiment, for example, as shown in FIG. 13, the gate insulator 130, the first interlayer-dielectric layer 141, the second interlayer-dielectric layer 142, and the first planarization layer 150 of the thin-film transistor layer TFTL may be removed with a laser in the second display area DA2. Alternatively, as shown in FIG. 14, the first interlayer-dielectric layer 141, the second interlayer-dielectric layer 142 and the first planarization layer 150 of the thin-film transistor layer TFTL may be removed with a laser in the second display area DA2. Alternatively, as shown in FIG. 15, the second interlayer-dielectric layer 142 and the first planarization layer 150 of the thin-film transistor layer TFTL may be removed with a laser in the second display area DA2. Alternatively, as shown in FIG. 16, the second interlayer-dielectric layer 142 of the thin-film transistor layer TFTL may be removed by a laser in the second display area DA2.

Figure 24:
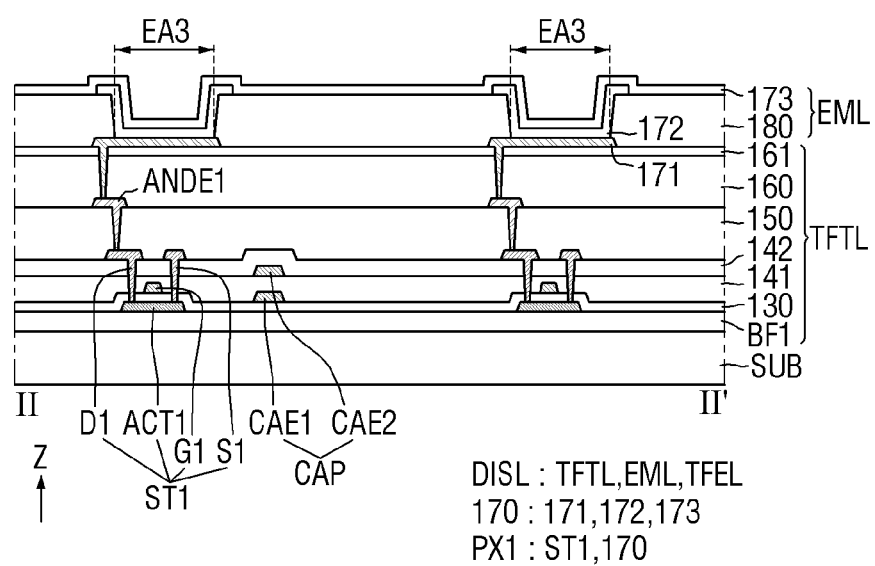
Figure 25:
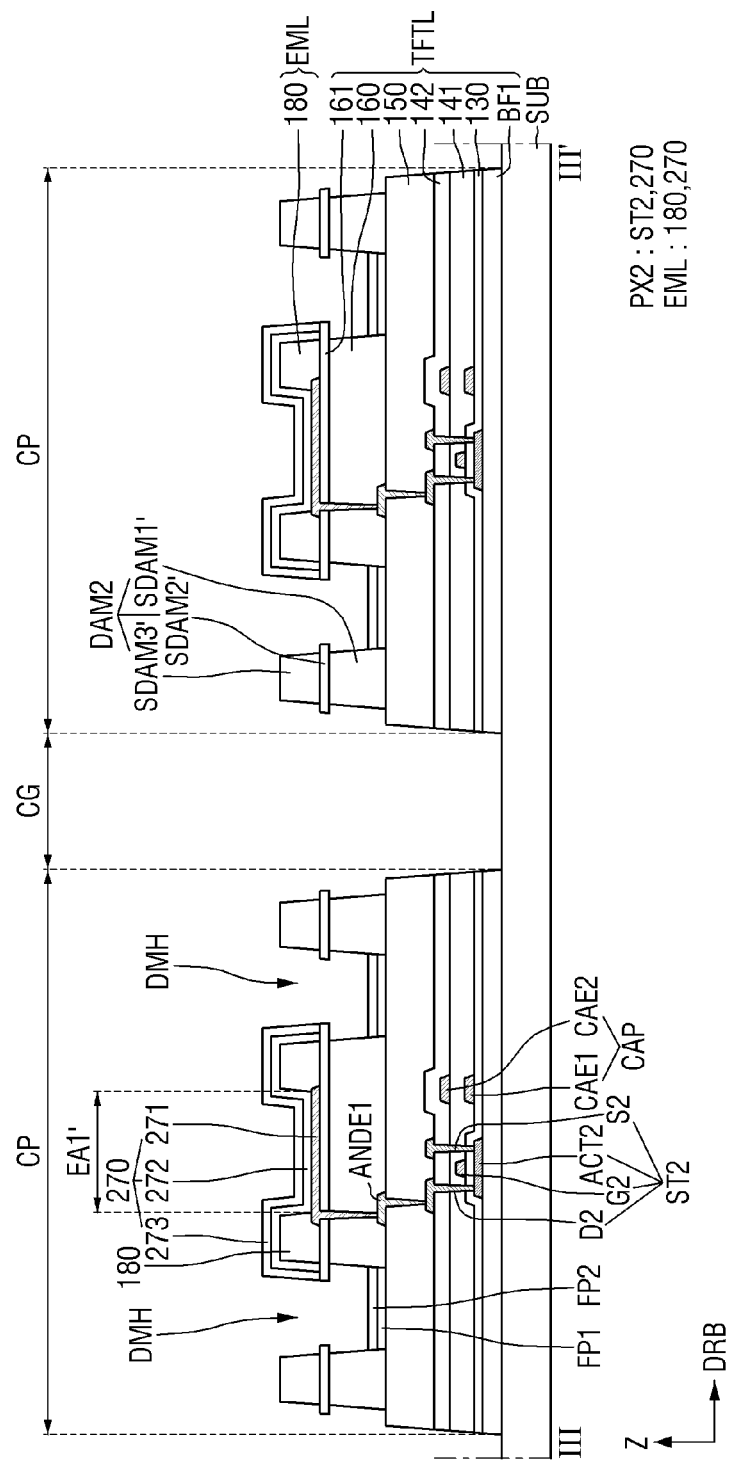
Figure 26:
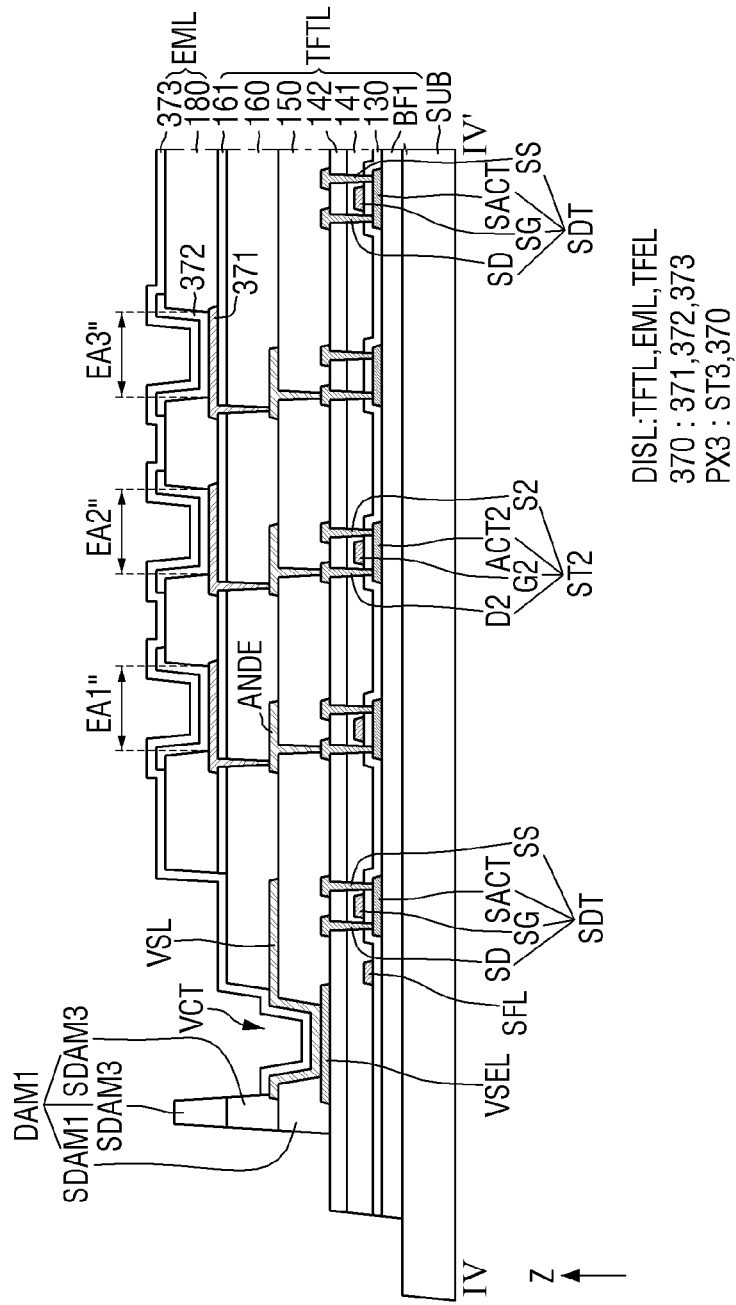

Third, as shown in FIGS. 24 to 26, an emission material layer EML including light-emitting elements is formed on the thin-film transistor layer TFTL in the first display area DA1, the second display area DA2 and the third display area DA3 (step S300 in FIG. 19).

The emission material layer EML includes first light-emitting elements 170, second light-emitting elements 270, and third light-emitting elements 370. The first light-emitting elements 170 are disposed in the first display area DA1 and each includes a first pixel electrode 171, a first emissive layer 172, and a first common electrode 173. The second light-emitting elements 270 are disposed in the second display area DA2 and each include a second pixel electrode 271, a second emissive layer 272, and a second common electrode 273. The third light-emitting elements 370 are disposed in the third display area DA3 and each includes a third pixel electrode 371, a third emissive layer 372, and a third common electrode 373.

The first pixel electrode 171, the second pixel electrode 271 and the third pixel electrode 273 are formed on the barrier layer 161 by a photolithography process. The first pixel electrode 171 may be connected to the pixel connection electrode ANDE1 through a contact hole penetrating the second planarization layer 160 and the barrier layer 161 in the first display area DA1. The second pixel electrode 271 may be connected to the pixel connection electrode ANDE1 through a contact hole penetrating the second planarization layer 160 and the barrier layer 161 in the second display area DA2. The third pixel electrode 273 may be connected to the pixel connection electrode ANDE1 through a contact hole penetrating the second planarization layer 160 and the barrier layer 161 in the third display area DA3.

The bank 180 is formed on the first pixel electrode 171, the second pixel electrode 271, the pixel electrode 173 and the barrier layer 161 by a photolithography process. The bank 180 may be formed to cover the edge of the first pixel electrode 171, the edge of the second pixel electrode 271, the edge of the third pixel electrode 371 and the contact hole penetrating through the second planarization layer 160 and the barrier layer 161.

By a deposition process using a mask, the first emissive layer 172 may be formed on the first pixel electrode 171, the second emissive layer 272 may be formed on the second pixel electrode 271, and the third emissive layer 372 may be formed on the third pixel electrode 371.

By using a photolithography process, the first common electrode 173 may be formed on the first emissive layer 172, the second common electrode 273 may be formed on the second emissive layer 272, and the third common electrode 373 may be formed on the third emissive layer 372. The first common electrode 173 and the second common electrode 273 may be directly connected to each other. The third common electrode 373 may not be directly connected to the first common electrode 173 or the second common electrode 273. The third common electrode 373 may not be electrically connected to the first common electrode 173 or the second common electrode 273.

The first floating pattern FP1 may be disposed on the second planarization layer 160 in the dam hole DMH. Since the second emissive layer 272 has poor step coverage, the second emissive layer 272 may not be disposed on the sidewalls of the dam hole DMH. The step coverage refers to the ability of subsequent layers to evenly cover levels ("steps") already present on the substrate without being disconnected. That is to say, the second emissive layer 272 may be disconnected at the dam hole DMH, and the first floating pattern FP1 may be a residual layer of the second emissive layer 272 that is not connected to the second emissive layer 272 but is disconnected from it. The first floating pattern FP1 may be made of the same material as the second emissive layer 272. When the size of the dam hole DMH is small, the first floating pattern FP1 may not exist.

In addition, the second floating pattern FP2 may be disposed on the first floating pattern FP1 in the dam hole DMH. Since the second common electrode 273 has poor step coverage, the second common electrode 273 may not be disposed on the sidewalls of the dam hole DMH. That is to say, the second common electrode 273 may be disconnected at the dam hole DMH, and the second floating pattern FP2 may be a residual layer of the second common electrode 273 that is not connected to the second common electrode 273 but is disconnected from it. The second floating pattern FP2 may be made of the same material as the second common electrode 273. When the size of the dam hole DMH is small, the second floating pattern FP2 may be disposed.

Figure 27:
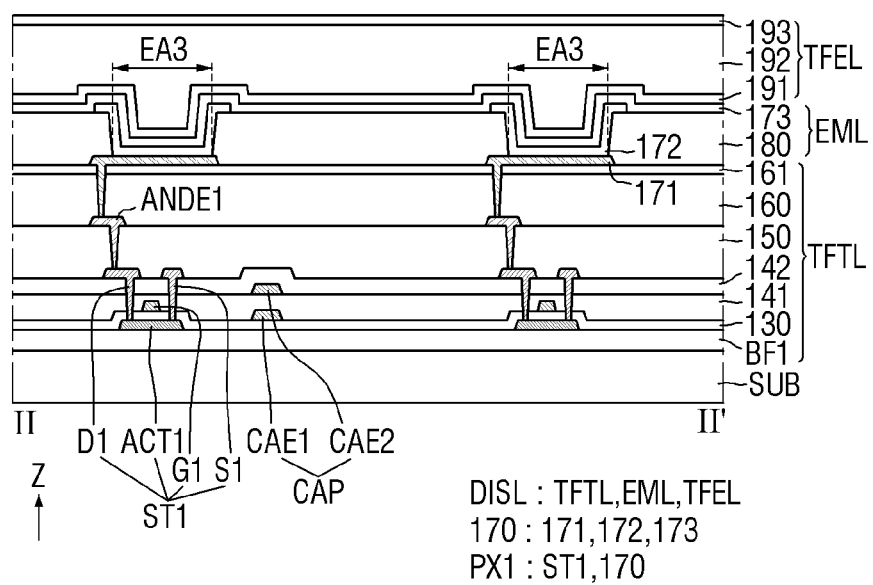
Figure 28:
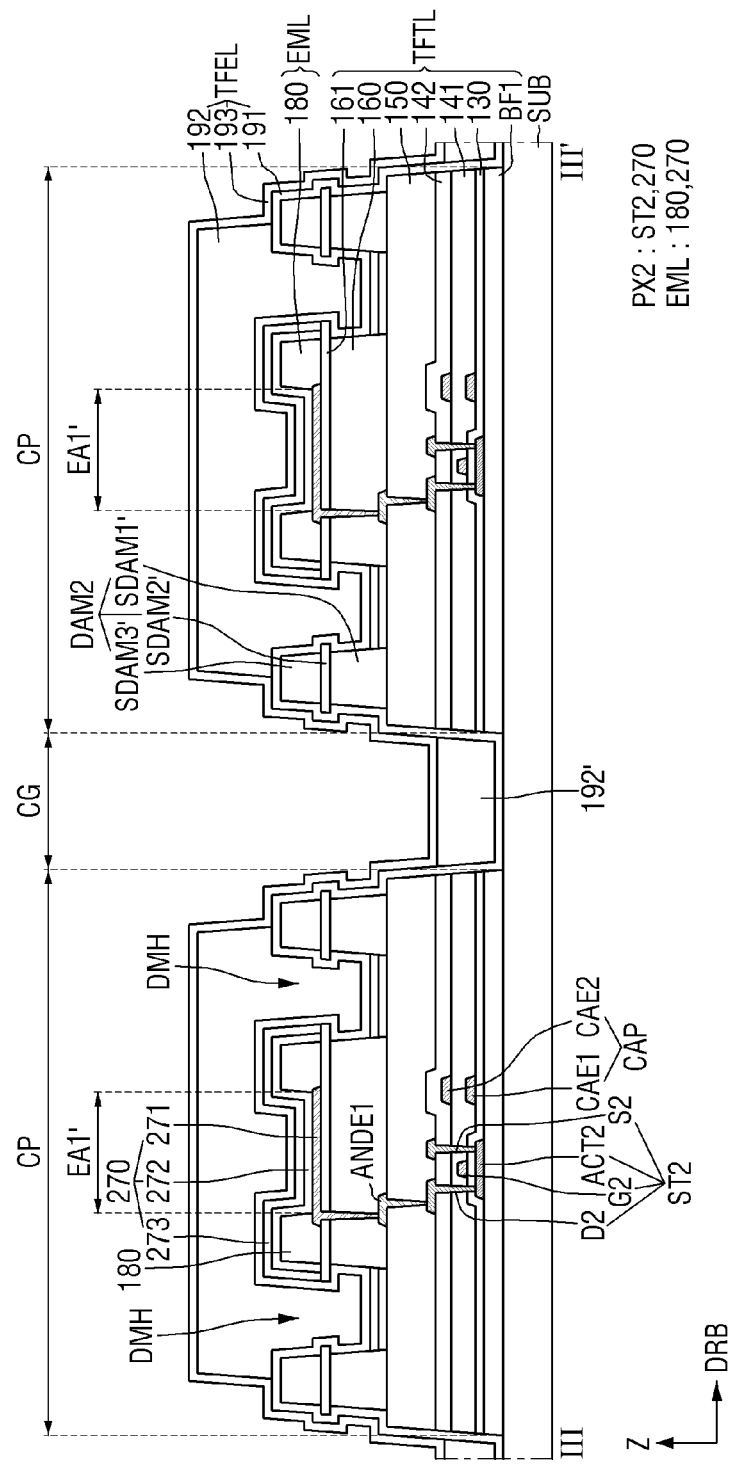
Figure 29:
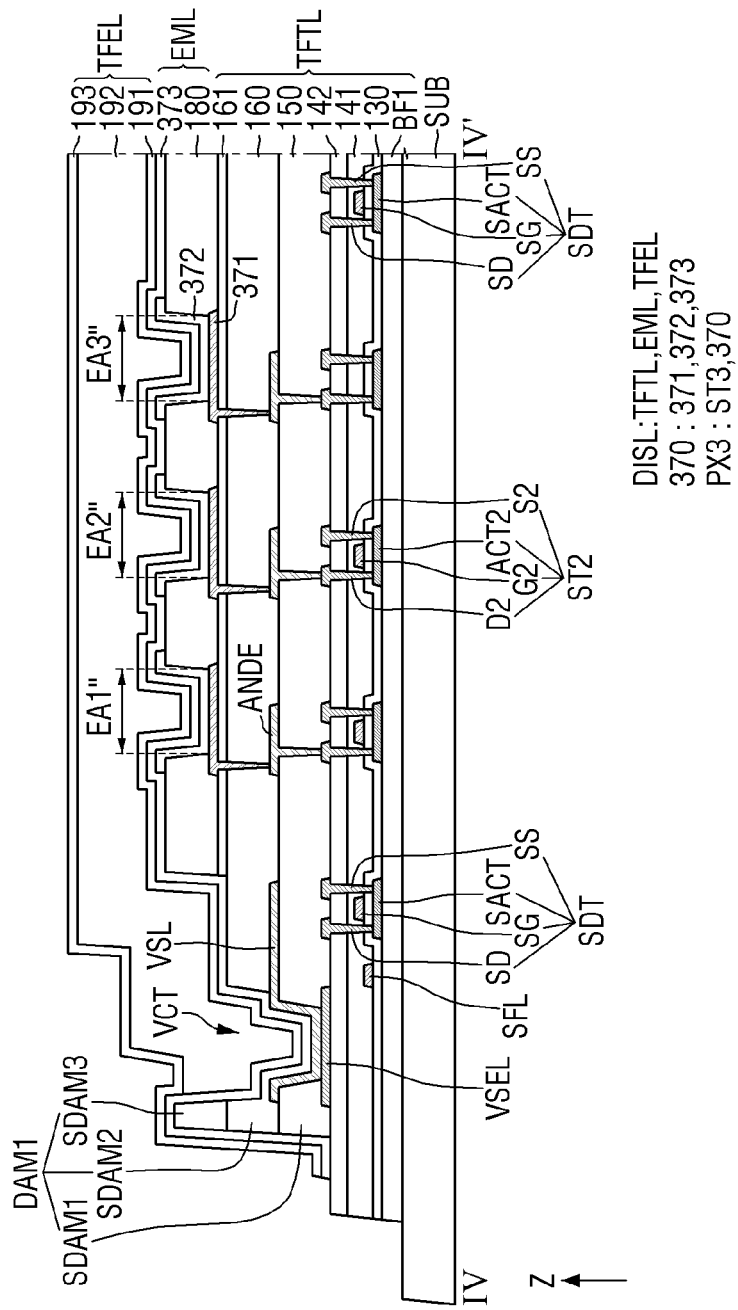

Fourth, as shown in FIGS. 27 to 29, the first inorganic encapsulation layer 191, the organic encapsulation layer 192 and the second inorganic encapsulation layer 193 are formed on the emission material layer EML in the first display area DA1, the second display area DA2 and the third display area DA3 (step S400 of FIG. 19).

An inorganic material is deposited on the first light-emitting elements 170 in the first display area DA1, the second light-emitting elements 270 in the second display area DA2, and the third light-emitting element 370 in the third display area DA3, to form the first inorganic encapsulation layer 191.

The first inorganic encapsulation layer 191 may be disposed on the first common electrode 173 of the first display area DA1, the second common electrode 273 of the second display area DA2, and the third common electrode 373 of the third display area DA3. In addition, the first inorganic encapsulation layer 191 may be disposed on the substrate SUB in the cut grooves CG of the second display area DA2.

In the first display area DA1, the second display area DA2 and the third display area DA3, an organic material is dropped onto the first inorganic encapsulation layer 191 by an inkjet process to form the organic encapsulation layer 192. In doing so, in order to reliably dispose the organic encapsulation layer 192 in the second dam DAM2 of the cut pattern CP, the organic material may be dropped onto the entire surface of the second display area DA2 during the inkjet process, instead of dropping it onto particular positions in the second dam DAM2 of the cut pattern CP. Accordingly, in the second display area DA2, the organic encapsulation layer 192 may be disposed in the second dam DAM2 of the cut pattern CP, and the organic pattern 192' made of the same material as the organic encapsulation layer 192 may be disposed on each of the cut grooves CG. That is to say, the organic encapsulation layer 192 and the organic pattern 192' may be formed simultaneously. The organic pattern 192' may be disposed on the first inorganic encapsulation layer 191 in each of the cut grooves CG.

An inorganic material is deposited on the organic encapsulation layer 192 in the first display area DA1, the second display area DA2 and the third display area DA3, to form the second inorganic encapsulation layer 193. The second inorganic encapsulation layer 193 may be disposed on the organic pattern 192' in each of the cut grooves CG.

Figure 30:
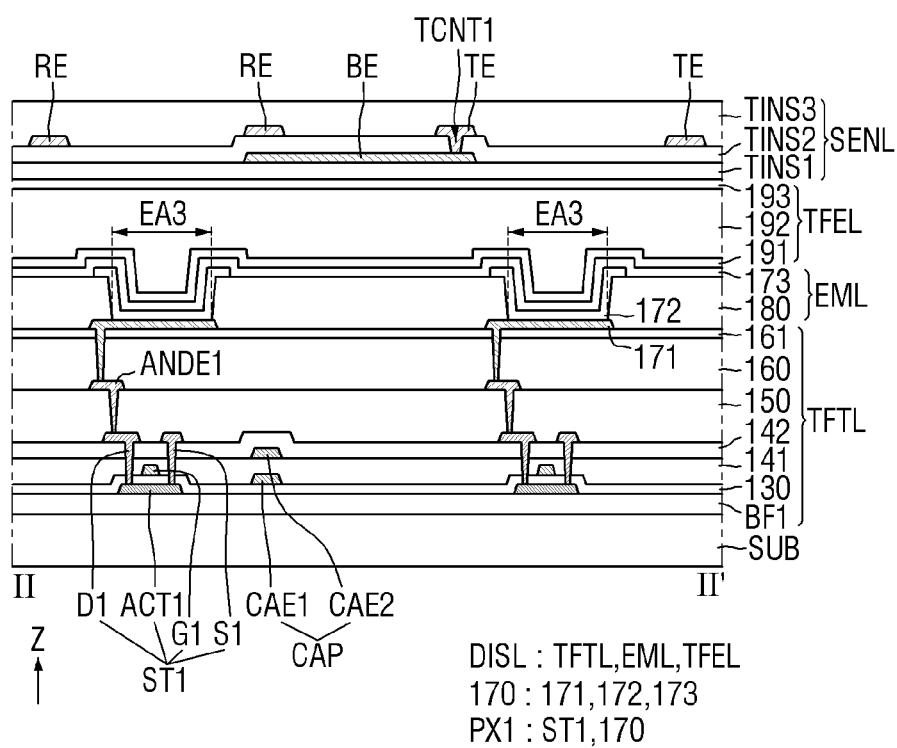
Figure 31:
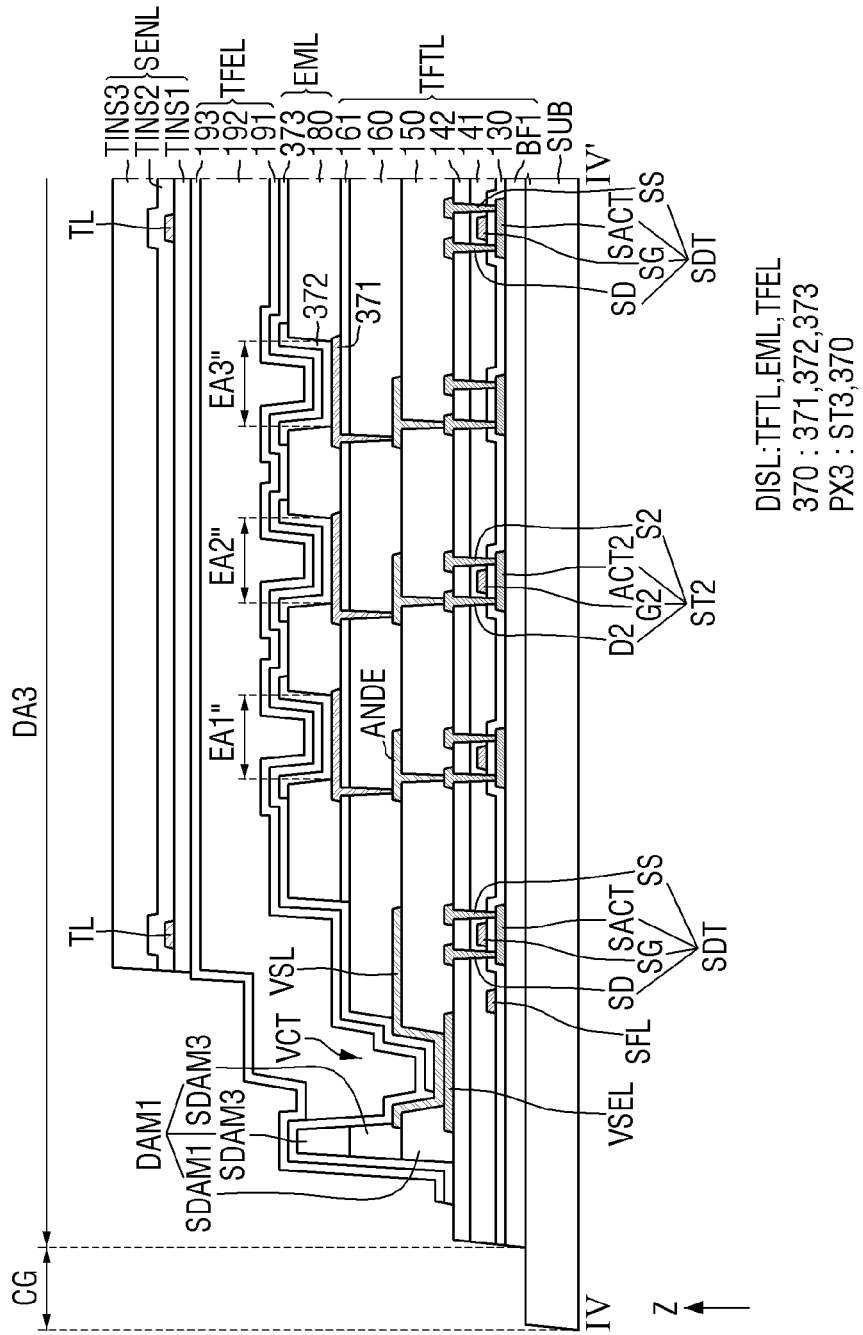

Fifth, as shown in FIGS. 30 and 31, a sensor electrode layer SENL is formed on the encapsulation layer TFEL in the first display area DA1 and the third display area DA2 (step S500 of FIG. 19).

An inorganic material is deposited on the encapsulation layer TFEL in the first display area DA1 and the third display area DA2 to form the first touch inorganic layer TINS1.

The touch connection electrode BE is formed on the first touch inorganic layer TINS1 in the first display area DA1 by using a photolithography process.

An inorganic material is deposited on the touch connection electrode BE and the first touch inorganic layer TIS1 in the first and third display areas DA1 and DA3, to form a second touch inorganic layer TINS2.

A driving electrode TE, a sensing electrode RE and a touch driving line TL are formed on the second touch inorganic layer TINS2 using a photolithography process.

An organic material is deposited on the driving electrode TE, the sensing electrode RE and the touch driving lines TL to form the touch organic layer TINS3. The touch organic layer TINS3 may be omitted.

As described above, in order to reliably dispose the organic encapsulation layer 192 in the second dam DAM2 of the cut pattern CP, the organic material may be dropped onto the entire surface of the second display area DA2 during the inkjet process, instead of dropping it onto particular positions in the second dam DAM2 of the cut pattern CP. Accordingly, in the second display area DA2, the organic encapsulation layer 192 may be disposed in the second dam DAM2 of the cut pattern CP, and the organic pattern 192' made of the same material as the organic encapsulation layer 192 may be disposed on each of the cut grooves CG. The organic pattern 192' may be disposed on the first inorganic encapsulation layer 191 in each of the cut grooves CG. Therefore, it is possible to prevent that moisture or oxygen is introduced and thus the emissive layer 272 is damaged, which may occur when the organic encapsulation layer 192 is not disposed in the second dam DAM2 of the cut pattern CP and thus a hole is defined in the first inorganic encapsulation layer 191 and the second inorganic encapsulation layer 193.

In embodiments of a display device and a method of fabricating the same, in order to reliably form an organic encapsulation layer over dams of cut patterns defined by cut portions to reduce the strain at the corner portions of a display device, the organic material is dropped onto the entire surface of second display areas at the corner portions during an inkjet process, instead of dropping it onto particular positions. By doing so, in the second display areas, an organic encapsulation layer may be formed in the dams of the cut patterns, and an organic pattern made of the same material as the organic encapsulation layer may be disposed at each of the cut portions. Therefore, it is possible to prevent that an emissive layer is damaged, which may occur when the organic encapsulation layer is not disposed in the dams of the cut patterns and thus moisture or oxygen is introduced through a hole defined in the first inorganic encapsulation layer or the second inorganic encapsulation layer.

The invention should not be construed as being limited to the embodiments set forth herein. Rather, these embodiments are provided so that this invention will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention.

What is claimed is:

1. A display device comprising:
 a display panel comprising corner portions having cut patterns defined by cut portions,
 wherein the display panel further comprises:
  a substrate;
  a light-emitting element comprising a pixel electrode, an emissive layer and a common electrode and disposed on the substrate in the cut pattern;
  a first inorganic encapsulation layer disposed on the common electrode in the cut pattern;
  an organic encapsulation layer disposed on the first inorganic encapsulation layer in the cut pattern; and
  an organic pattern disposed on the substrate in the cut portion, and
 wherein the cut patterns are defined by cut grooves formed between the cut patterns adjacent to each other while the substrate is not removed at the cut grooves.

2. The display device of claim 1, wherein the organic encapsulation layer and the organic pattern include a same material.

3. The display device of claim 1, wherein the first inorganic encapsulation layer is disposed between the substrate and the organic pattern at the cut portions.

4. The display device of claim 3, wherein the first inorganic encapsulation layer is in contact with the substrate at the cut portions.

5. The display device of claim 1, wherein the display panel further comprises a second inorganic encapsulation layer disposed on the organic encapsulation layer and the organic pattern.

6. The display device of claim 1, wherein the display panel further comprises:
 a buffer layer disposed on the substrate in the cut pattern;
 an active layer of a thin-film transistor disposed on the buffer layer in the cut pattern;
 a gate insulator disposed on the active layer in the cut pattern;
 a gate electrode of the thin-film transistor disposed on the gate insulator in the cut pattern; and
 a first interlayer-dielectric layer disposed on the gate electrode in the cut pattern, and
 wherein the light-emitting element is disposed on the first interlayer-dielectric layer.

7. The display device of claim 6, wherein the organic pattern is disposed on the buffer layer at the cut portions.

8. The display device of claim 7, wherein the first inorganic encapsulation layer is disposed between the buffer layer and the organic pattern at the cut portions.

9. The display device of claim 8, wherein the first inorganic encapsulation layer is in contact with the buffer layer at the cut portions.

10. The display device of claim 6, wherein the organic pattern is disposed on the gate insulator at the cut portions.

11. The display device of claim 10, wherein the first inorganic encapsulation layer is disposed between the gate insulator and the organic pattern at the cut portions.

12. The display device of claim 11, wherein the first inorganic encapsulation layer is in contact with the gate insulator at the cut portions.

13. The display device of claim 6, wherein the organic pattern is disposed on the first interlayer-dielectric layer at the cut portions.

14. The display device of claim 13, wherein the first inorganic encapsulation layer is disposed between the first interlayer-dielectric layer and the organic pattern at the cut portions.

15. The display device of claim 14, wherein the first inorganic encapsulation layer is in contact with the first interlayer-dielectric layer.

16. The display device of claim 6, wherein the display panel further comprises:

a capacitor electrode disposed on the first interlayer-dielectric layer in the cut pattern;

a second interlayer-dielectric layer disposed on the capacitor electrode in the cut pattern;

a source electrode and a drain electrode of the thin-film transistor disposed on the second interlayer-dielectric layer in the cut pattern and connected to the active layer through contact holes penetrating the gate insulator, the first interlayer-dielectric layer and the second interlayer-dielectric layer;

a first planarization layer disposed on the first connection electrode in the cut pattern;

a connection electrode disposed on the first planarization layer in the cut pattern and connected to the source electrode or the drain electrode through a contact hole penetrating the first planarization layer; and a second planarization layer disposed on the connection electrode in the cut pattern, wherein the light-emitting element is disposed on the second planarization layer, and the pixel electrode is connected to the connection electrode through a contact hole penetrating the second planarization layer.

17. The display device of claim 16, wherein the organic pattern is disposed on the second interlayer-dielectric layer at the cut portions.

18. The display device of claim 17, wherein the first inorganic encapsulation layer is disposed between the second interlayer-dielectric layer and the organic pattern at the cut portions.

19. The display device of claim 18, wherein the first inorganic encapsulation layer is in contact with the second interlayer-dielectric layer.

20. The display device of claim 16, wherein the first planarization layer and the second planarization layer are not disposed in the cut portions.

* * * * *